US009784795B2

(12) United States Patent
Umemura et al.

(10) Patent No.: US 9,784,795 B2
(45) Date of Patent: Oct. 10, 2017

(54) CHARGE CONTROL DEVICE, BATTERY PACK, AND CHARGER

(71) Applicant: MAKITA CORPORATION, Anjo-shi, Aichi (JP)

(72) Inventors: Takuya Umemura, Anjo (JP); Tadahiko Kobayakawa, Anjo (JP); Hitoshi Suzuki, Anjo (JP)

(73) Assignee: MAKITA CORPORATION, Anjo-shi (JP)

(*) Notice: Subject to any disclaimer, the term of this patent is extended or adjusted under 35 U.S.C. 154(b) by 155 days.

(21) Appl. No.: 14/741,788

(22) Filed: Jun. 17, 2015

(65) Prior Publication Data

US 2015/0372512 A1 Dec. 24, 2015

(30) Foreign Application Priority Data

Jun. 23, 2014 (JP) .................. 2014-128313

(51) Int. Cl.
*H01M 10/46* (2006.01)
*G01R 31/36* (2006.01)
*H02J 7/00* (2006.01)
*G01K 13/00* (2006.01)
*H02J 7/04* (2006.01)

(52) U.S. Cl.
CPC ......... *G01R 31/3606* (2013.01); *G01K 13/00* (2013.01); *H02J 7/0004* (2013.01); *H02J 7/0008* (2013.01); *H02J 7/0011* (2013.01); *H02J 7/0021* (2013.01); *H02J 7/0044* (2013.01); *H02J 7/0073* (2013.01); *H02J 7/0075* (2013.01); *H02J 7/041* (2013.01); *H02J 7/047* (2013.01); *H02J 2007/0067* (2013.01)

(58) Field of Classification Search
CPC ...... H02J 7/0004; H02J 7/0011; H02J 7/0021; H02J 7/0073; H02J 7/0091
USPC .................. 320/112, 132, 134, 136, 150
See application file for complete search history.

(56) References Cited

U.S. PATENT DOCUMENTS 6,275,009 B1    8/2001 Sakakibara et al.
2009/0058370 A1  3/2009 Odaohhara
(Continued)

FOREIGN PATENT DOCUMENTS

EP    1 100 172 A2    5/2001
EP    2 149 958 A2    2/2010
(Continued)

OTHER PUBLICATIONS

Sep. 17, 2015 Extended Search Report issued in European Patent Application No. 15173197.3.

*Primary Examiner* — Edward Tso
(74) *Attorney, Agent, or Firm* — Oliff PLC

(57) ABSTRACT

A charge control device of one example of the present invention comprises a temperature detection unit, a storage unit, and an upper limit setting unit. The storage unit stores a reference current characteristic and at least one of a first current characteristic and a second current characteristic as a charging current characteristic, and stores a reference voltage characteristic and at least one of a first voltage characteristic and a second voltage characteristic as a charging voltage characteristic. The upper limit setting unit selects a characteristic used to set upper limits of a charging current and a charging voltage to the battery from among a plurality of the charging current characteristics and a plurality of the charging voltage characteristics stored in the storage unit.

16 Claims, 16 Drawing Sheets

(56) References Cited

U.S. PATENT DOCUMENTS

| | | |
|---|---|---|
| 2010/0007310 A1 | 1/2010 | Kawamoto et al. |
| 2011/0043166 A1 | 2/2011 | Kawai et al. |
| 2013/0181683 A1 | 7/2013 | Wang et al. |
| 2013/0193924 A1 | 8/2013 | Kurokawa et al. |

FOREIGN PATENT DOCUMENTS

| | | |
|---|---|---|
| EP | 2 290 781 A2 | 3/2011 |
| JP | 2009-055729 A | 3/2009 |

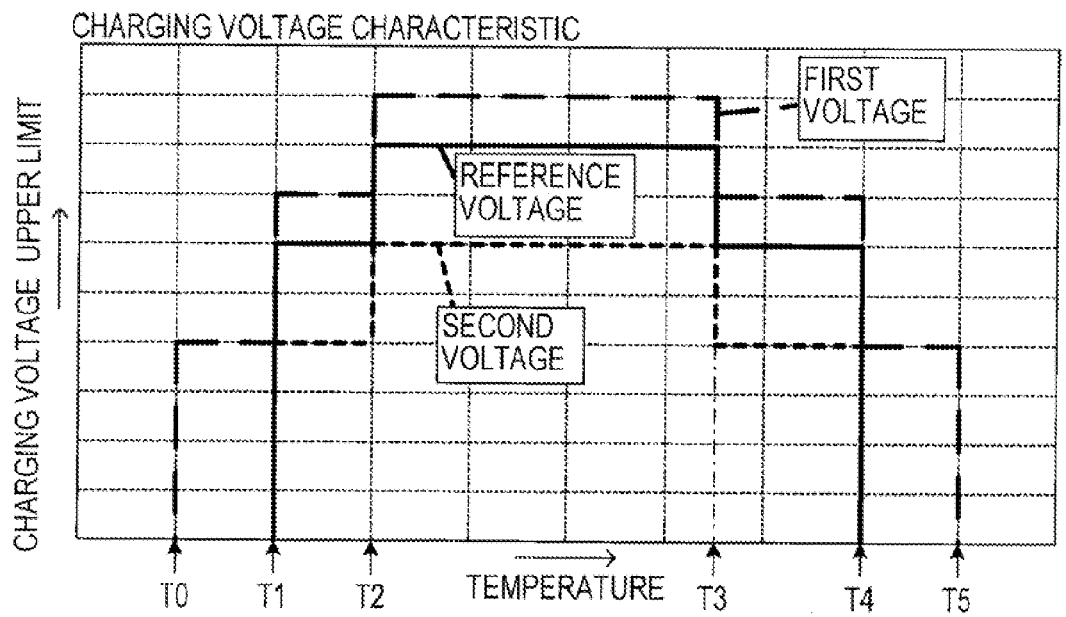
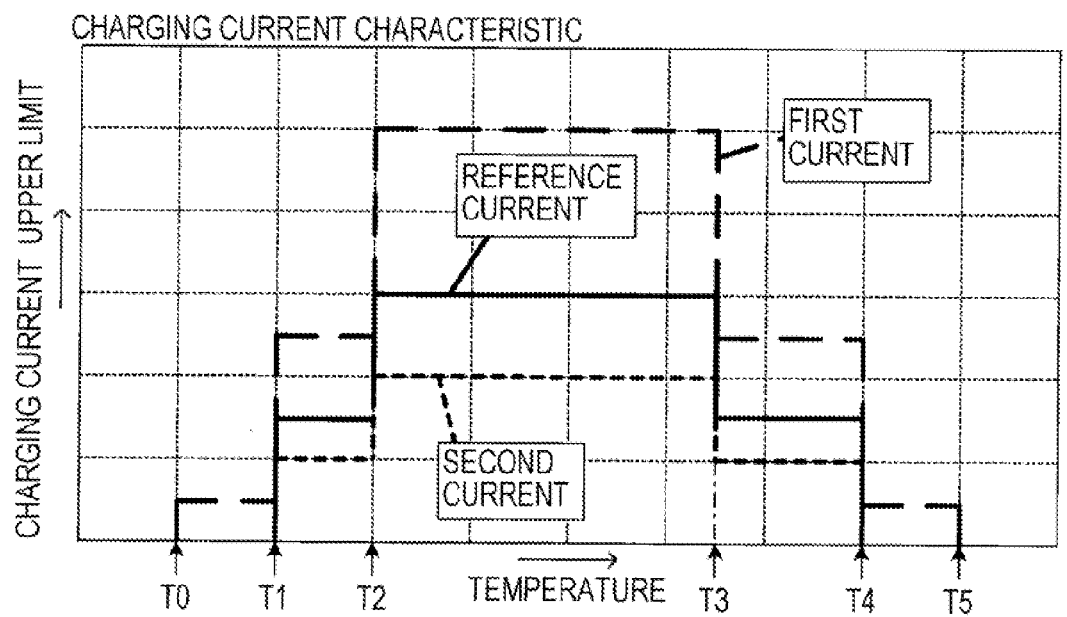

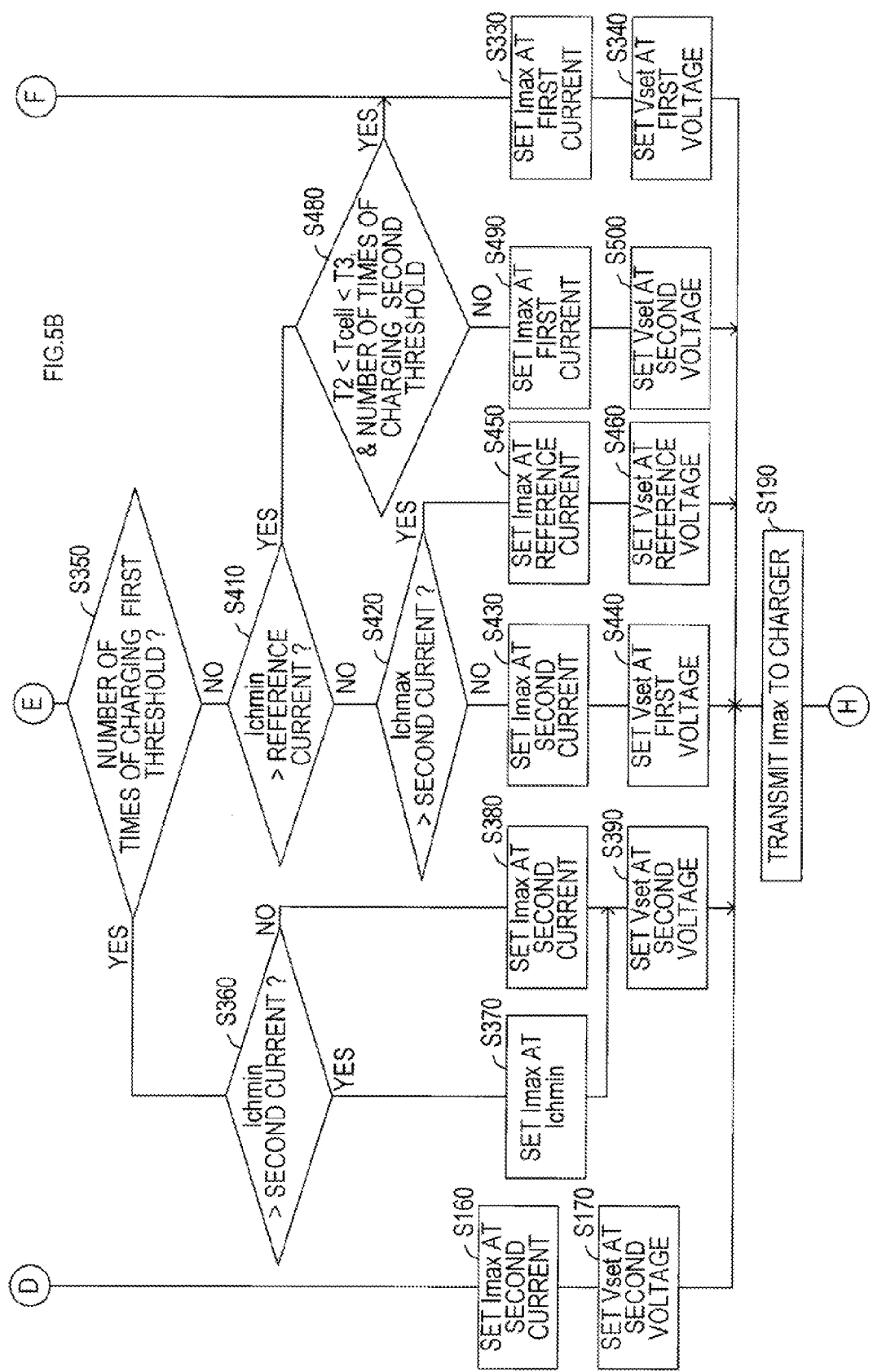

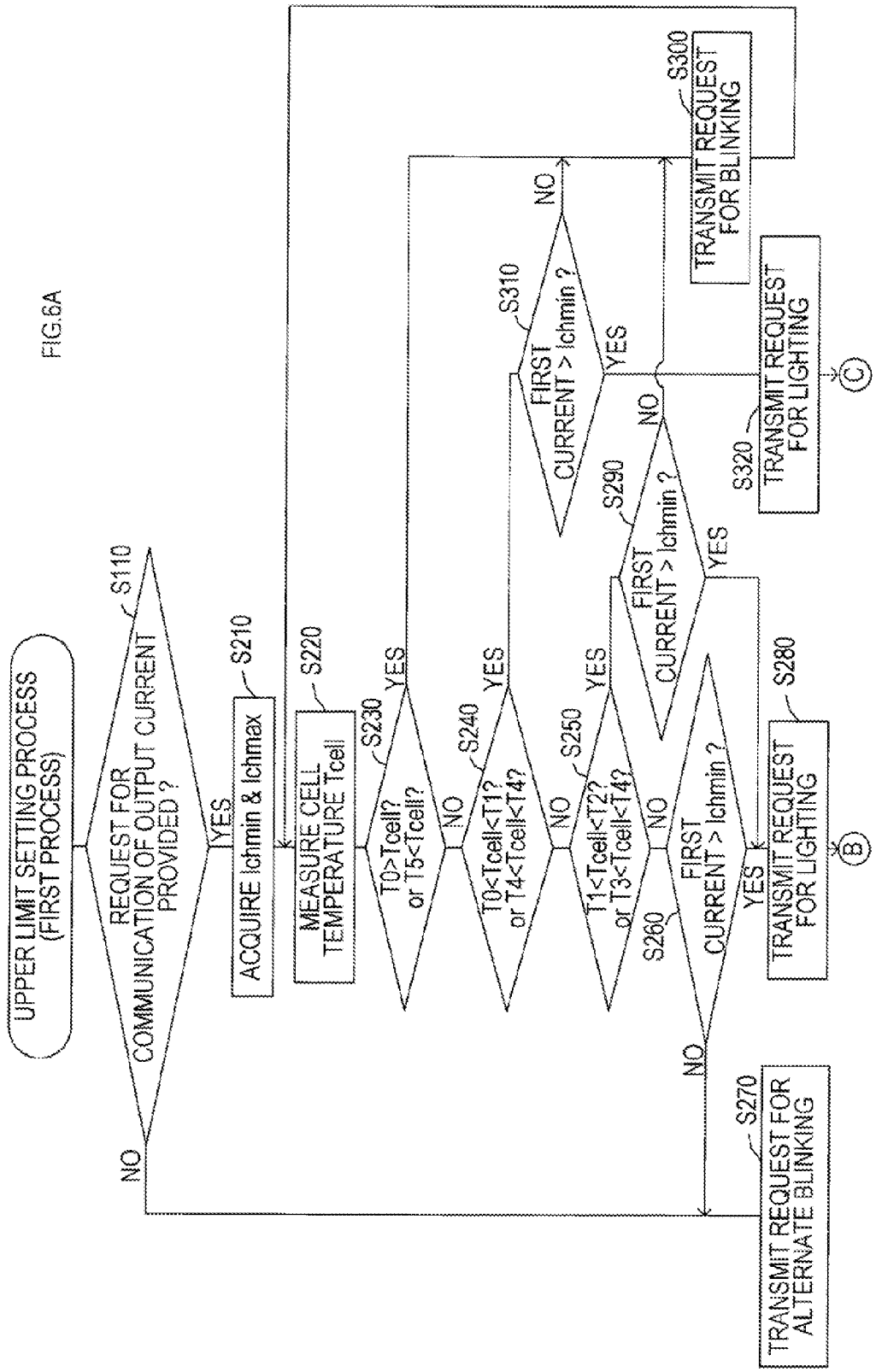

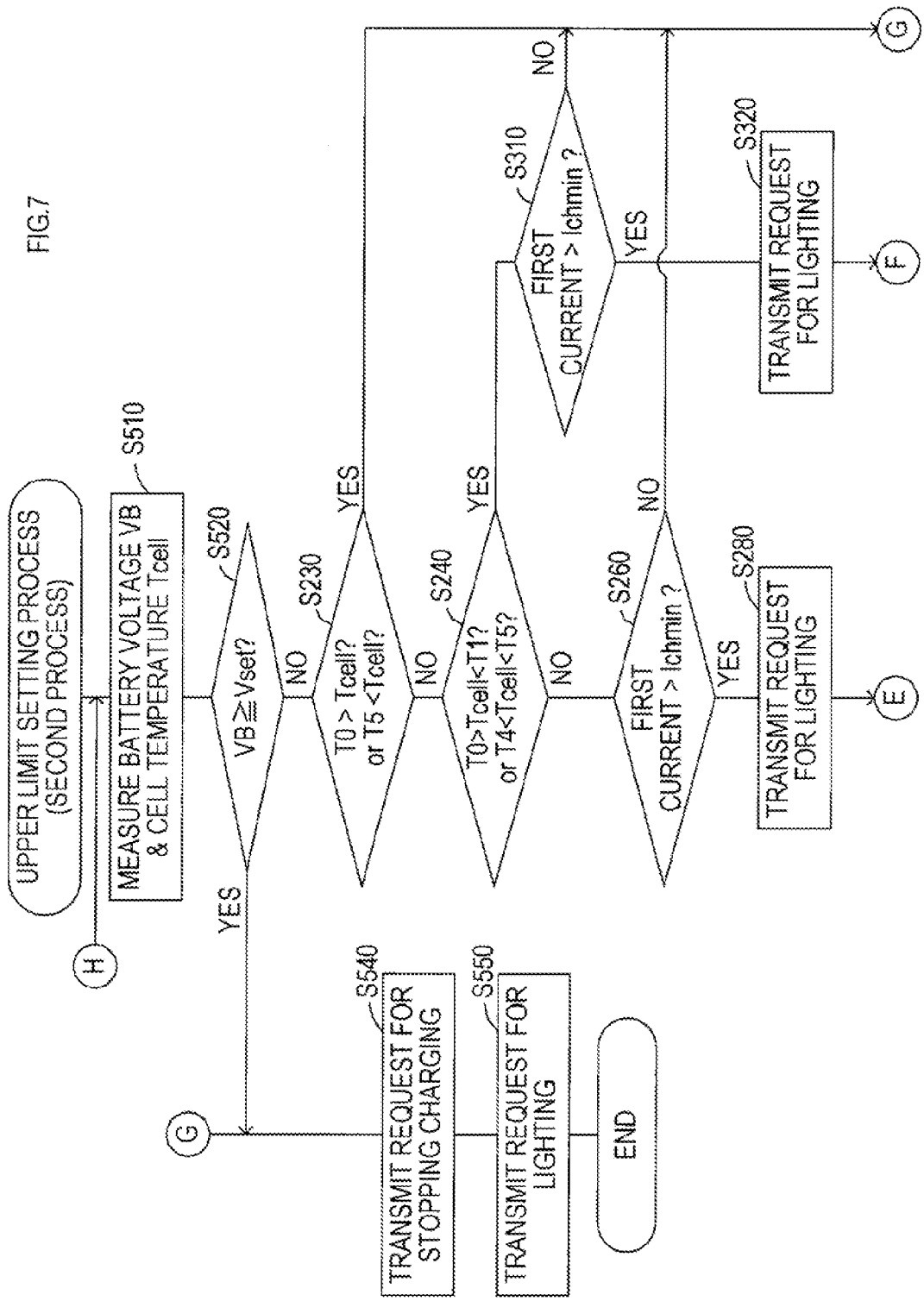

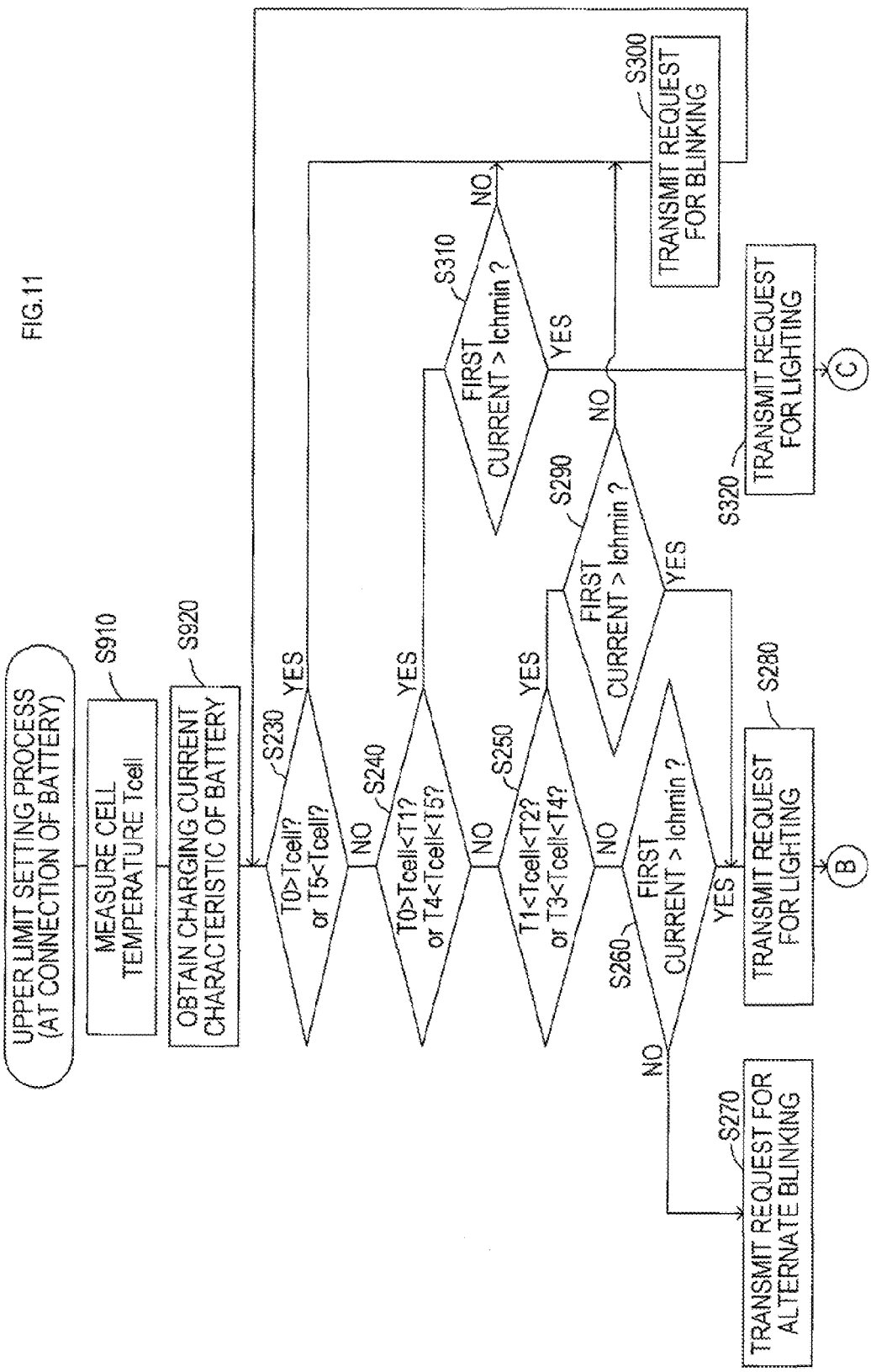

CHARGE CONTROL DEVICE, BATTERY PACK, AND CHARGER

CROSS-REFERENCE TO RELATED APPLICATIONS

This application claims the benefit of Japanese Patent Application No. 2014-128313 filed Jun. 23, 2014 in the Japan Patent Office, the disclosure of which is incorporated herein by reference.

BACKGROUND

The present invention relates to a charge control device that limits upper limits of a charging current and a charging voltage according to a battery temperature, a battery pack provided with this charge control device, and a charger.

As illustrated in FIGS. 12A and 12B, in a battery such as a lithium-ion battery, a temperature range of the battery is classified into a low temperature range (T1-T2), an ordinary temperature range (T2-T3), and a high temperature range (T3-T4), and upper limits of a charging current and a charging voltage are defined for each range (see, for example, Japanese Unexamined Patent Application Publication No. 2009-55729, etc.).

A reason for setting the upper limits is to ensure safety during charging, as well as to inhibit a life span of the battery from being shortened due to charging. During charging, the battery is charged with a charging current equal to or lower than the upper limit obtained from a charging current characteristic and a battery temperature shown in FIG. 12B. Then, when a battery voltage reaches the upper limit obtained from a charging voltage characteristic and a battery temperature shown in FIG. 12A, the charging of the battery is stopped.

SUMMARY

The charging current characteristic and the charging voltage characteristic are each set one in number for the battery to be charged. In such a case, there is a problem that charging of the battery cannot be performed optimally according to the capability of a charger used to charge the battery.

For example, in a case where an outputtable current of the charger is larger than the upper limit of the charging current defined by the charging current characteristic, it is necessary to reduce the output current from the charger to the upper limit or smaller to charge the battery. This results in failing to effectively utilize a charging capability of the charger, and the battery cannot be charged in a short time, for example.

Moreover, in the charging current characteristic and the charging voltage characteristic, the temperature range in which charging of the battery is possible is defined within T1-T4 as illustrated in FIGS. 12A and 12B, and thus, there is also a problem that the battery cannot be charged at a temperature lower or higher than that in this temperature range.

Furthermore, in the charging voltage characteristic, the upper limit of the charging voltage is uniquely set according to the battery temperature, and thus, there is also a problem that the battery cannot be charged to a desired amount of charge because the charging voltage cannot be increased in order to increase the amount of charge of the battery.

Still further, the upper limit of the charging current is defined by the charging current characteristic, and thus, there is also a problem that the charging current is too large when a gentle charging with a low charging current is desired for a battery used (charged and discharged) many times, for example.

It is preferred that the battery can be charged successfully by making it possible to change the temperature range at the time of charging of the battery or the upper limits of the charging current and the charging voltage according to a state of the battery or the charger, surrounding environmental conditions, or the like.

A charge control device of one aspect of the present invention comprises a temperature detection unit that detects a battery temperature, and a storage unit that stores a charging current characteristic indicating relationships between the battery temperature and an upper limit of a charging current and a charging voltage characteristic indicating relationships between the battery temperature and an upper limit of a charging voltage.

An upper limit setting unit sets each of the upper limits of the charging current and the charging voltage from a charger to a battery on the basis of the battery temperature detected by the temperature detection unit and the charging current characteristic and the charging voltage characteristic stored in the storage unit.

The storage unit stores, as the charging current characteristic, a reference current characteristic and at least one of a first current characteristic having a current value larger than that in the reference current characteristic with respect to the battery temperature and a second current characteristic having a current value smaller than that in the reference current characteristic with respect to the battery temperature.

The storage unit also stores, as the charging voltage characteristic, a reference voltage characteristic and at least one of a first voltage characteristic having a voltage value larger than that in the reference voltage characteristic with respect to the battery temperature and a second voltage characteristic having a voltage value smaller than that in the reference voltage characteristic with respect to the battery temperature.

The upper limit setting unit selects the charging current characteristic and the charging voltage characteristic used to set the upper limits of the charging current and the charging voltage to the battery from among a plurality of the charging current characteristics and a plurality of the charging voltage characteristics stored in the storage unit, and sets the upper limits of the charging current and the charging voltage.

Thus, according to the present invention, as shown in FIG. 13, in a coordinate system with the horizontal axis denoting the charging current and with the vertical axis denoting the charging voltage, given that the charging current and the charging voltage defined on the basis of the reference current characteristic and the reference voltage characteristic are at the origin, the charging current or the charging voltage away from the origin can be selected as the upper limit during charging.

Thus, for example, in a case where a charging capability of the charger is high, when the charging current is set to be larger than the reference current at the origin and the charging voltage is set to be smaller than the reference voltage at the origin, it is possible to cause the charger to charge the battery at high speed, while inhibiting deterioration of the battery due to charging.

For example, when the charging current is set to be smaller than the reference current at the origin and the charging voltage is set to be larger than the reference voltage at the origin, it is possible to increase an amount of charge from the charger to the battery, while inhibiting deterioration of the battery due to charging.

For example, when the charging current is set to be smaller than the reference current at the origin and the charging voltage is set to be smaller than the reference voltage at the origin, it is possible to cause the charger to perform a gentle charging (low-current and low-voltage charging) for the battery used (charged and discharged) many times.

For example, when the charging current and the charging voltage are respectively set to be larger than the reference current and the reference voltage at the origin under a specific condition, it is possible to cause the charger to charge the battery at high speed and at high voltage as well.

The upper limit of the charging voltage obtained from the charging voltage characteristic selected by the upper limit setting unit can be used as one of a charging completion voltage for determining completion of charging of the battery, an abnormality determination voltage for detecting abnormality of the battery voltage during charging, a CV value at the time of performing a Constant Current—Constant Voltage (CCCV) charging, and a value of a target charging voltage during charging.

Here, the upper limit setting unit may be configured to select the charging current characteristic and the charging voltage characteristic according to states of the battery and the charger, surrounding environmental conditions, or the like. Specifically, the charging current characteristic and the charging voltage characteristic may be selected on the basis of a parameter related to a value of the charging current from the charger to the battery, for example.

In this case, as the parameter related to the value of the charging current from the charger to the battery, a value of an outputtable current capable of being supplied from the charger to the battery may be used, or a value of an actual charging current actually supplied from the charger to the battery may be used.

When the value of the outputtable current is used as the parameter related to the value of the charging current, the upper limit setting unit may select, as the charging current characteristic and the charging voltage characteristic, the first current characteristic and the second voltage characteristic in a case where the value of the outputtable current is larger than the upper limit of the charging current obtained on the basis of the battery temperature and the reference current characteristic.

In this way, in a case where the value of the outputtable current from the charger is larger than the reference current at the origin shown in FIG. 13 (i.e., in a case where the charging capability of the charger is high), the high-speed charging can be performed by limiting the charging voltage to a second voltage or smaller, which is smaller than the reference voltage, while the upper limit of the charging current is set to a first current, which is larger than the reference current.

In this case, the charging current to the battery is set to be larger than the reference current, but the charging voltage is limited to the second voltage or smaller, which is smaller than the reference voltage, and thus, it is possible to inhibit a life span of the battery from being shortened due to the high-speed charging.

On the other hand, in the first current characteristic having a current value larger than that in the reference current characteristic and the first voltage characteristic having a voltage value larger than that in the reference voltage characteristic, a temperature range in which the upper limits of the charging current and the charging voltage are set to permit charging may be wider than a temperature range in the reference current characteristic and the reference voltage characteristic.

In this way, when the upper limit setting unit selects the first current characteristic as the charging current characteristic and selects the first voltage characteristic as the charging voltage characteristic, the temperature range in which charging of the battery is possible can be extended.

In a case where the upper limit setting unit selects, as the charging current characteristic and the charging voltage characteristic, the first current characteristic and the first voltage characteristic, respectively, and sets the upper limits of the charging current and the charging voltage within a temperature range other than the temperature range in the reference current characteristic and the reference voltage characteristic (in other words, within the extended ranges having a temperature lower or higher than that in the temperature range in the reference current characteristic and the reference voltage characteristic) on the basis of the battery temperature, the upper limit setting unit may inform a user of that effect.

Specifically, in the first current characteristic and the first voltage characteristic, the above-described extended ranges are ranges in which the upper limits of the charging current and the charging voltage in the reference current characteristic and the reference voltage characteristic are "0", and thus, the upper limits of the charging current and the charging voltage are smaller than those in the regular temperature range.

Thus, in a case where the upper limit setting unit selects the first current characteristic and the first voltage characteristic and sets the upper limits of the charging current and the charging voltage when the battery temperature is in the extended ranges, charging in the temperature range in which charging could not be performed conventionally becomes possible, while a charging time becomes longer than that in the regular case.

If the charging time is prolonged as above, the user may feel a sense of distrust. Thus, the user is informed in advance that the charging time will become longer than that in the regular case.

Next, in a case where the value of the outputtable current from the charger to the battery is equal to or larger than the upper limit of the charging current obtained on the basis of the battery temperature detected by the temperature detection unit and the first current characteristic, a first charge prohibition unit may prohibit the charger from charging the battery.

In this way, in the case where the value of the outputtable current is equal to or larger than the upper limit of the charging current, it is possible to inhibit the charger from starting charging the battery, to thereby limit the charging current to the upper limit or smaller more reliably.

In a case where the value of the outputtable current is not acquired, a second charge prohibition unit may prohibit the charger from charging the battery.

Alternatively, in a case where the value of the outputtable current is not acquired, a charge permission unit may permit the charger to charge the battery by setting values set in advance as the upper limits of the charging current and the charging voltage, provided that the battery temperature detected by the temperature detection unit is within a specified chargeable temperature range.

In this way, even in the case where the value of the outputtable current from the charger to the battery is not acquired, the charger can charge the battery.

In this case, the charge permission unit may be configured to set, as the upper limits of the charging current and the charging voltage, values at least smaller than the upper limits obtained from the reference current characteristic and the reference voltage characteristic (e.g., the upper limits obtained from the second current characteristic and the second voltage characteristic) in order not to deteriorate the battery due to charging.

In the meantime, in the charging current characteristic and the charging voltage characteristic, charging of the battery is prohibited in the temperature range in which the upper limit of the charging current and the upper limit of the charging voltage are "0", and thus, it is not always necessary to define a temperature range in which charging of the battery is started.

However, in a case where the outputtable current from the charger is large, the charging current may exceed the upper limit immediately after charging is started, to thereby deteriorate the battery, depending on the battery temperature at the time of starting charging.

Thus, the charge control device of the present invention may be further provided with a determination unit that determines a temperature range of the battery temperature in which charging of the battery is started, on the basis of the value of the outputtable current and the first current characteristic.

In this case, if the storage unit is provided to the battery and the determination unit is provided to the charger, the determination unit may acquire the first current characteristic from the storage unit provided to the battery and determine the temperature range.

Next, in a case where the upper limit setting unit uses the value of the actual charging current actually supplied from the charger to the battery as a parameter used to select the charging current characteristic and the charging voltage characteristic, the upper limit setting unit may be configured as below.

Specifically, in this case, the upper limit setting unit may be configured to detect the actual charging current supplied from the charger to the battery, to compare the value of the detected actual charging current with the upper limit of the charging current under a present temperature condition obtained from each charging current characteristic, and to select the charging voltage characteristic suitable for passage of the actual charging current on the basis of a comparison result.

In this way, for example, in a case where the value of the actual charging current is smaller than the upper limit obtained from the second current characteristic, the first voltage characteristic having a larger voltage value is selected. In a case where the value of the actual charging current is smaller than the upper limit obtained from the reference current characteristic (the reference current), the reference voltage characteristic is selected. In a case where the value of the actual charging current is larger than the reference current, the second voltage characteristic having a smaller voltage value is selected. In such a manner, the upper limit of the charging voltage can be successfully set according to the value of the actual charging current without deteriorating the battery.

In the case where the charging voltage characteristic is selected on the basis of the value of the actual charging current as above, the charging voltage characteristic cannot be selected until the charger starts charging the battery because the actual charging current does not flow.

Thus, the upper limit setting unit may select, as the charging voltage characteristic, the second voltage characteristic having the lowest upper limit of the charging voltage when the charger starts charging the battery.

In this case, the upper limit setting unit may select, as the charging voltage characteristic, the second voltage characteristic in a case where the battery temperature detected by the temperature detection unit is within a specified chargeable temperature range to cause the charger to start charging the battery, and subsequently, may select the charging voltage characteristic using the value of the actual charging current, thereby to set the upper limit of the charging voltage and to extend a temperature range in which charging of the battery is performed.

In this way, it is possible to inhibit deterioration of the battery caused by starting charging of the battery when the battery temperature is high or low.

The charge control device of the present invention may be housed in a battery pack together with the battery and embodied as one function of the battery pack.

Alternatively, all or part of the elements other than the storage unit that stores the characteristics specific to the battery may be provided to the charger, to thereby cause the battery pack and the charger to fulfill the function as the charge control device of the present invention.

Further alternatively, the charge control device of the present invention may be provided to the charger and embodied as one function of the charger. In this case, the charger may be designed to allow the user to designate a kind of the battery to be charged op that the characteristics of the battery to be charged can be read from the storage unit.

BRIEF DESCRIPTION OF THE DRAWINGS

The present invention will now be described by way of example with reference to the accompanying drawings, in which:

FIGS. 3A and 3B are explanatory diagrams showing a charging voltage characteristic and a charging current characteristic, respectively, stored in a ROM in a battery control circuit;

FIG. 5B is a flowchart showing the remainder of the upper limit setting process (second process);

FIG. 6A is a flowchart showing a modified example of the upper limit setting process (first process) shown in FIG. 4A;

FIG. 7 is a flowchart showing a modified example of the upper limit setting process (second process) shown in FIG. 5A;

FIG. 11 is a flowchart showing part of an upper limit setting process performed in a charge control circuit of the third embodiment when the battery is connected;

DETAILED DESCRIPTION OF THE PREFERRED EMBODIMENTS

First Embodiment

Figure 1:
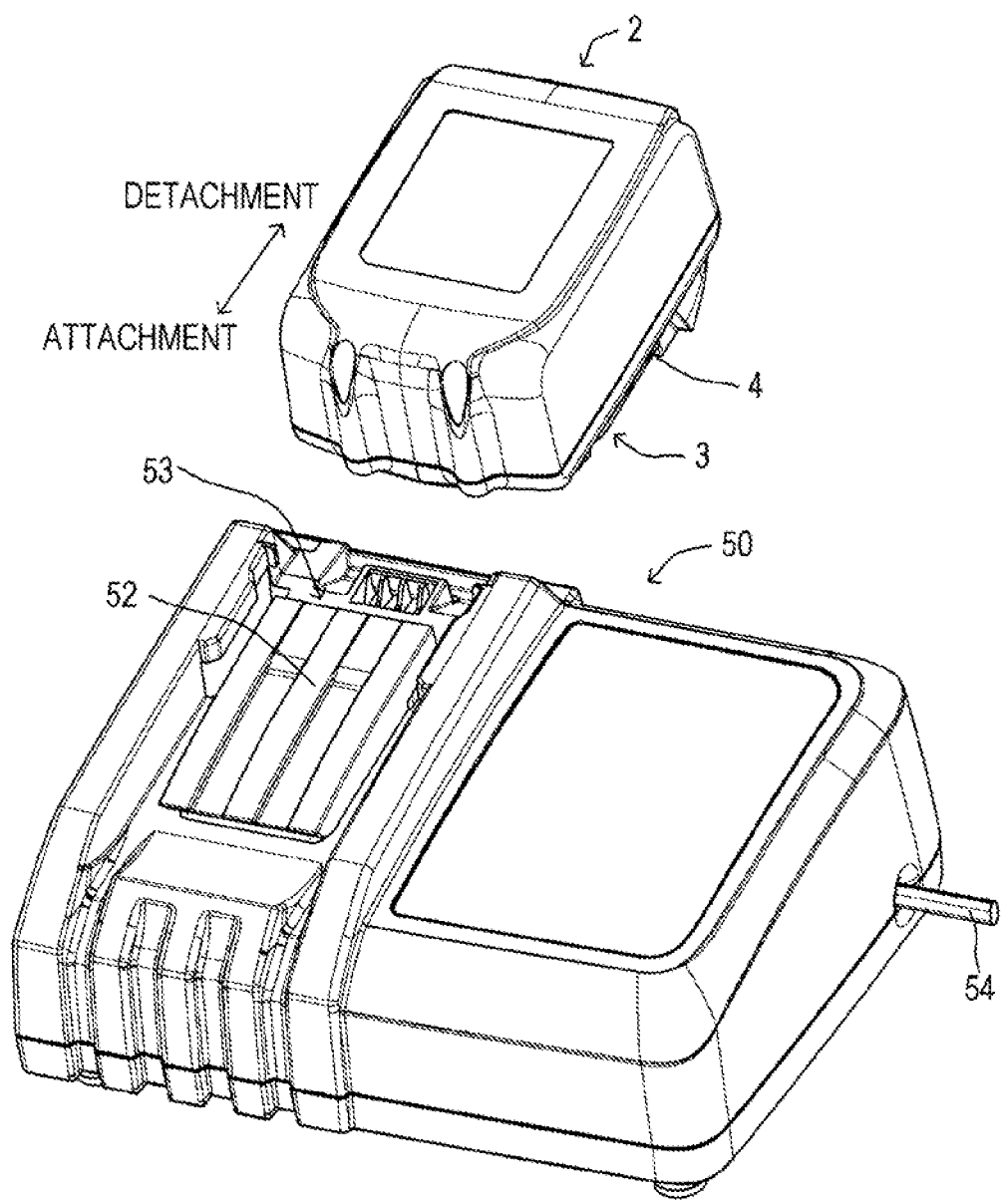
FIG. 1 is a perspective view showing an appearance of a battery pack and a charger.

As shown in FIG. 1, a charging system of the present embodiment comprises a battery pack 2 and a charger 50 that charges the battery pack 2. The battery pack 2 is detachably attached to various rechargeable motor-driven appliances, such as a rechargeable power tool, a rechargeable vacuum cleaner, a rechargeable grass cutter, etc., and supplies electric power to a DC motor, etc., which is a power source of them.

The charger 50 generates a charging voltage (DC voltage) for battery charging by receiving power supply from an external power source (generally, a commercial power source: AC voltage) via a power-supply cord 54, and supplies electric power to a battery 10 (see FIG. 2) in the battery pack 2.

Provided on an upper surface of the charger 50 is an attachment portion 52 for attachment (placement, in other words) of the battery pack 2. The attachment portion 52 is shaped according to a shape of an attachment portion 3 on the back of the battery pack 2 so that the battery pack 2 can be attached by sliding.

The attachment portion 52 has a terminal portion 53 provided therein that is fittable to a terminal portion 4 on the back of the battery pack 2 when the battery pack 2 is attached.

Figure 2:
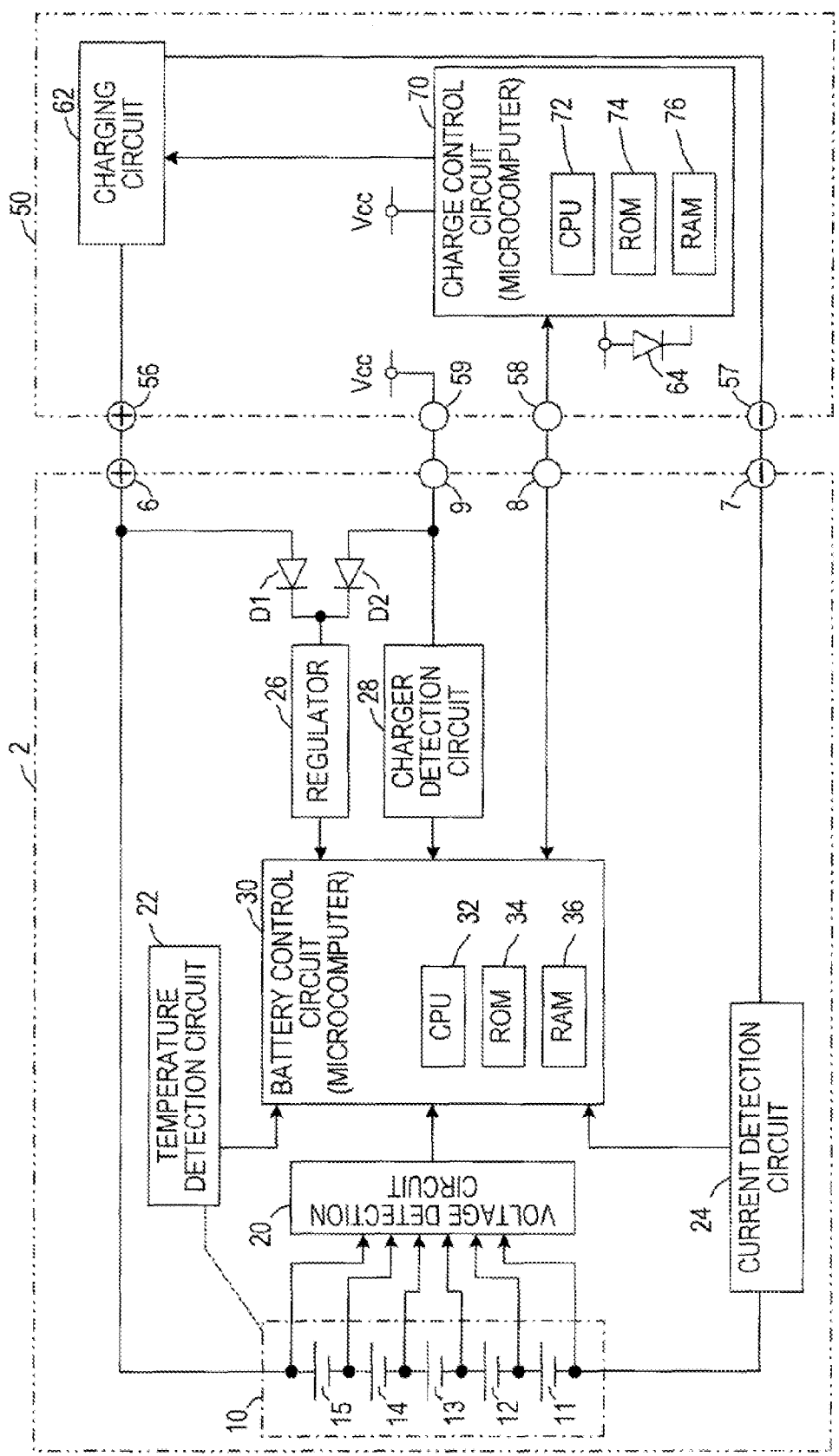
FIG. 2 is a circuit diagram showing a circuit configuration of a battery pack and a charger of a first embodiment.

Provided to the terminal portion 53 of the charger 50 are terminals 56, 57, 58, and 59 (see FIG. 2). Provided to the terminal portion 4 of the battery pack 2 are terminals 6, 7, 8, and 9 (see FIG. 2). The terminals 56, 57, 58, and 59 and the terminals 6, 7, 8, and 9 are respectively connected to each other when the battery pack 2 is attached to the attachment portion 52 of the charger 50.

In the battery pack 2, the terminals 6 and 7 are terminals for passage of a charging current from the charger 50 and a drive current to a rechargeable motor-driven appliance. The terminal 6 is a positive terminal connected to a positive side of the battery 10. The terminal 7 is a negative terminal connected to a negative side of the battery 10. The terminal 8 is a communication terminal for communication between the battery pack 2 and the charger 50 or the rechargeable motor-driven appliance. The terminal 9 is a terminal for receiving a power-supply voltage (DC constant voltage) Vcc for driving internal circuits from the charger 50.

In the charger 50, the terminals 56 and 57 are terminals for charging the battery 10 when the battery pack 2 is attached to the charger 50. The terminal 56 is a positive terminal to be connected to the positive terminal 6 of the battery pack 2. The terminal 57 is a negative terminal to be connected to the negative terminal 7 of the battery pack 2. The terminal 58 is a communication terminal to be connected to the terminal 8 of the battery pack 2 for communication with the battery pack 2. The terminal 59 is a terminal for supplying the battery pack 2 with the power-supply voltage Vcc for driving the internal circuits, which has been generated in the charger 50.

Next, a circuit configuration of the battery pack 2 and the charger 50 will be described with reference to FIG. 2. As shown in FIG. 2, the battery pack 2 has the battery 10 housed therein that is configured with a plurality of (five in the drawing) chargeable and dischargeable cells 11, 12, 13, 14, and 15 connected in series to each other.

The positive side of the battery 10 is connected to the positive terminal 6, and the negative side of the battery 10 is connected to the negative terminal 7. The battery 10 is a lithium-ion battery, in which upper limits of a charging current and a charging voltage need to be controlled during charging.

The battery pack 2 comprises a voltage detection circuit 20, a temperature detection circuit 22, a current detection circuit 24, a regulator 26, a charger detection circuit 28, and a battery control circuit 30.

The voltage detection circuit 20 is a circuit that detects respective cell voltages Vcell of the cells 11, 12, 13, 14, and 15 constituting the battery 10 and a battery voltage VB between both ends of the battery 10 and that inputs the respective cell voltages Vcell and the battery voltage VB to the battery control circuit 30.

The respective cell voltages Vcell of the cells 11, 12, 13, 14, and 15 are used to determine an abnormality in the cells 11, 12, 13, 14, and 15 or variation in the respective cell voltages Vcell, in the battery control circuit 30. The temperature detection circuit 22 detects an internal temperature (cell temperature Tcell) of the battery 10 via a temperature detection element (not shown) housed in the battery 10, and outputs the detection result to the battery control circuit 30 in order to inhibit overheat of the battery 10.

The current detection circuit 24 is a circuit that is provided in a current conduction path running from the negative terminal 7 to the negative side of the battery 10 and that detects a current flowing through the path. The current detection circuit 24 includes, for example, a resistor provided in series with the current conduction path and a detection circuit that outputs a voltage between both ends of the resistor to the battery control circuit 30 as a detection result of the current.

The regulator 26 is designed to generate a power-supply voltage (DC constant voltage) for driving the internal circuits by receiving the DC voltage supplied via a diode D1 or a diode D2 and to supply the power-supply voltage to the battery control circuit 30 and peripheral circuits thereof.

An anode of the diode D1 is connected to the positive side of the battery 10, and an anode of the diode D2 is connected to the terminal 9 that receives supply of the power-supply voltage Vcc from the charger 50. Cathodes of the diodes D1 and D2 are connected to the regulator 26. In this way, the battery voltage VB or the power-supply voltage Vcc of the charger 50 can be inputted to the regulator 26.

The regulator 26 can generate the power-supply voltage for driving the internal circuits by receiving power supply from the battery 10.

When the regulator 26 cannot generate the power-supply voltage due to decrease in the remaining amount of power of the battery 10, the regulator 26 can generate the power-supply voltage for driving the internal circuits by receiving the power-supply voltage Vcc supplied from the charger 50 when the battery pack 2 is connected to the charger 50.

The charger detection circuit 28 is a circuit that is connected to the terminal 9 via which the power-supply voltage Vcc of the charger 50 is applied when the battery pack 2 is attached to the charger 50, and that detects that the battery pack 2 is attached to the charger 50 from a terminal voltage of the terminal 9. The detection result is inputted to the battery control circuit 30.

The battery control circuit 30 comprises a microcomputer mainly configured with a CPU 32, a ROM 34, a RAM 36, and so on. The battery control circuit 30 is operated by receiving power supply from the charger 50 via the regulator 26, and monitors a state of the battery 10 on the basis of detection signals from the voltage detection circuit 20, the temperature detection circuit 22, and the current detection circuit 24.

Provided to the battery control circuit 30 is a communication port for communication with the charger 50 or the rechargeable motor-driven appliance to which the battery pack 2 is attached. The communication port is connected to the communication terminal 8 via a communication line.

When detecting an abnormality in cell voltage, charge/discharge current, battery temperature, or the like, the battery control circuit 30 transmits an abnormality detection signal to that effect to the charger 50 or the rechargeable motor-driven appliance via the communication terminal 8, to thereby stop charge/discharge of the battery 10.

When the charger detection circuit 28 detects attachment of the battery pack 2 to the charger 50, the battery control circuit 30 performs an upper limit setting process for setting the upper limits of the charging current and the charging voltage (upper limit charging current and upper limit charging voltage). The upper limit setting process is a main process related to the present invention, and thus, will be described in detail later.

During charging of the battery 10 by the charger 50, the battery control circuit 30 monitors the charging current and the charging voltage so that the charging current and the charging voltage do not exceed the upper limits (upper limit charging current and upper limit charging voltage).

The charger 50 comprises a charging circuit 62 that charges the battery 10 by receiving power supply from the external power source (commercial power source, etc.), a charge control circuit 70 that controls the charging of the battery 10 by the charging circuit 62, and an indication unit 64 that indicates an operating state of the charger 50.

The charging circuit 62 generates the DC voltage for charging the battery 10 with power supplied by the external power source, as well as generates the power-supply voltage Vcc for driving the internal circuits. In addition, the charging circuit 62 is designed such that output current (charging current) to the battery 10 can be changed within a range from a minimum current value Ichmin to a maximum current value Ichmax under control by the charge control circuit 70.

These current values (the minimum current value Ichmin and the maximum current value Ichmax) are values determined depending on the capability of the charger 50, and are stored in the charge control circuit 70 in advance. The charge control circuit 70 comprises a microcomputer mainly configured with a CPU 72, a ROM 74, a RAM 76, and so on, similarly to the battery control circuit 30.

When the battery pack 2 is attached to the charger 50, the charge control circuit 70 controls the charging circuit 62 on the basis of the upper limit of the charging current (upper limit charging current Imax) inputted from the battery pack 2 to the charge control circuit 70 via the communication terminal 58, and charges the battery 10 such that the charging current to the battery 10 does not exceed the upper limit charging current Imax.

The indication unit 64 is configured with three light-emitting diodes (LEDs), LED 1 to LED 3. The charge control circuit 70 selectively causes these three LEDs to light up or blink, to thereby indicate a charging state of the battery 10 by the charger 50.

Next, an explanation will be given of the upper limit setting process performed by the battery control circuit 30. Stored in the ROM 34 in the battery control circuit 30 are control programs for performing various control processes including the upper limit setting process and maps indicating a charging voltage characteristic and a charging current characteristic shown in FIGS. 3A and 3B.

Figure 12A:
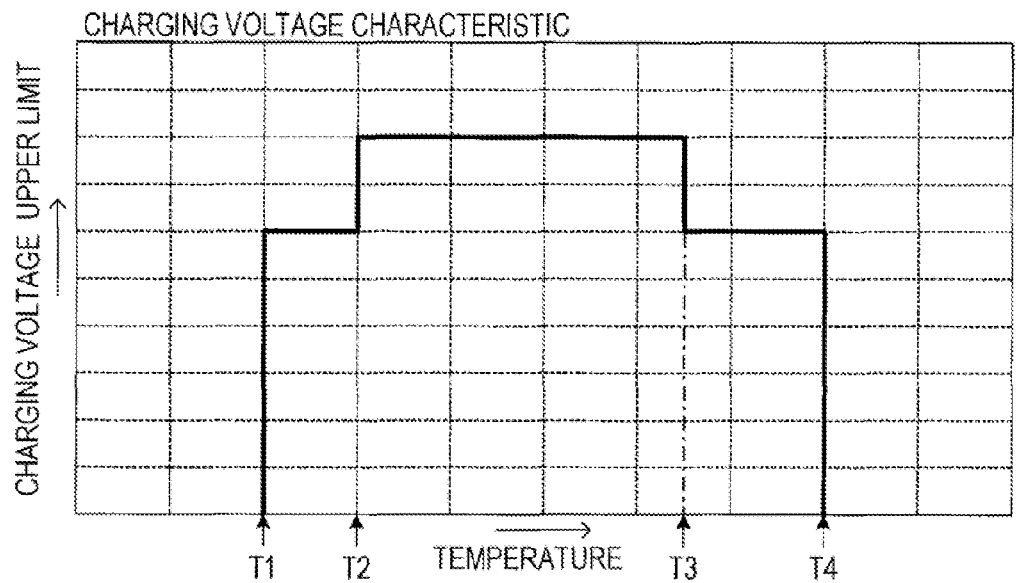
FIGS. 12A and 12B are explanatory diagrams showing one example of a conventional charging voltage characteristic and charging current characteristic, respectively.
Figure 12B:
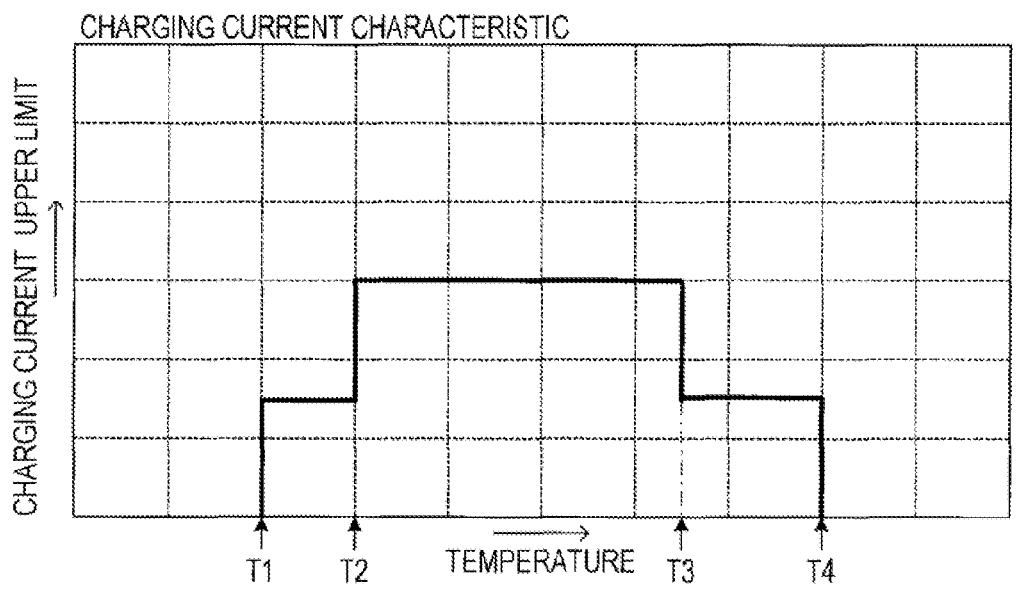
Figure 13:
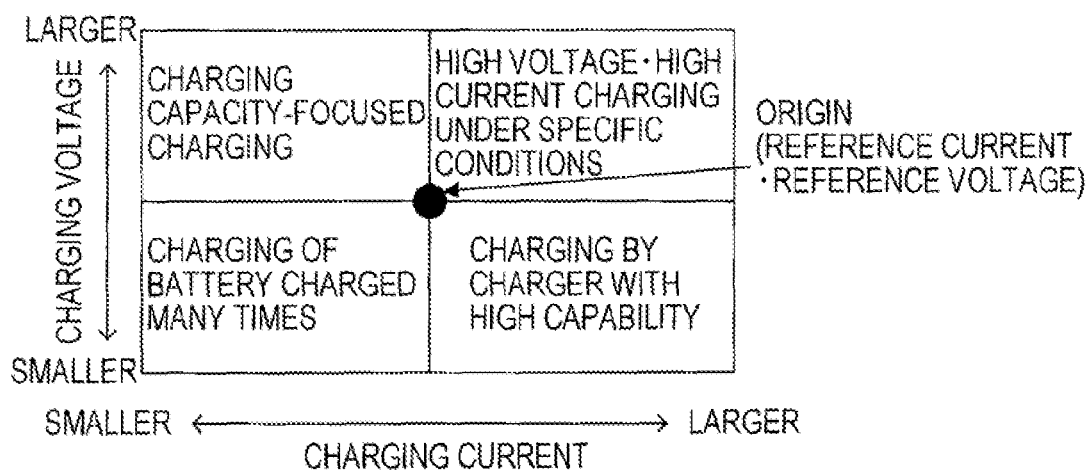
FIG. 13 is an explanatory diagram explaining an operation of setting upper limits of a charging current and a charging voltage of the present invention.

As shown in FIGS. 3A and 3B, in the present embodiment, a first voltage characteristic and a second voltage characteristic, and a first current characteristic and a second current characteristic are provided as the charging voltage characteristic and the charging current characteristic, respectively, in addition to a reference voltage characteristic and a reference current characteristic that are the same as conventional ones shown in FIGS. 12A and 12B, respectively.

In the first voltage characteristic, a voltage value is set at a value higher than that in the reference voltage characteristic. In the first current characteristic, a current value is set at a value higher than that in the reference current characteristic. In the second voltage characteristic, a voltage value is set at a value lower than that in the reference voltage characteristic. In the second current characteristic, a current value is set at a value lower than that in the reference current characteristic.

In the reference voltage characteristic, the reference current characteristic, the second voltage characteristic, and the second current characteristic, a temperature range in which charging is possible is classified into three, i.e., a low temperature range (T1-T2), an ordinary temperature range (T2-T3), and a high temperature range (T3-T4).

In the low temperature range (T1-T2) and the high temperature range (T3-T4), the upper limits of the charging voltage and the charging current are set so as to be smaller than those in the ordinary temperature range (T2-T3).

In the first voltage characteristic and the first current characteristic, in addition to the above three temperature ranges, a low-temperature-side extended range (T0-T1) having a temperature lower than that in the low temperature range (T1-T2), and a high-temperature-side extended range (T4-T5) having a temperature higher than that in the high temperature range (T3-T4) are provided as temperature ranges in which charging is possible.

As for the first voltage characteristic and the first current characteristic, in the low temperature range (T1-T2), the ordinary temperature range (T2-T3), and the high temperature range (T3-T4), the upper limits of the charging voltage and the charging current are set so as to be larger than those in the reference voltage characteristic and the reference current characteristic, respectively.

The upper limits in the low temperature range (T1-T2) and the high temperature range (T3-T4) are smaller than the upper limits in the ordinary temperature range (T2-T3). The upper limits in the low-temperature-side extended range (T0-T1) and the high-temperature-side extended range (T4-T5) are even smaller than the upper limits in the low temperature range (T1-T2) or the high temperature range (T3-T4).

The upper limit setting process includes a process at connection to the charger (first process) and a process during charging (second process). The first process is a process performed from when the battery pack 2 is attached to the charger 50 till when charging of the battery 10 by the charger 50 is started. The second process is a process performed from when the charging of the battery 10 by the charger 50 is started. The upper limit setting process is performed by the battery control circuit 30.

An explanation will be given of the first process as the upper limit setting process with reference to FIGS. 4A and 4B, and an explanation will be given of the second process as the upper limit setting process with reference to FIGS. 5A and 5B.

Figure 4A:
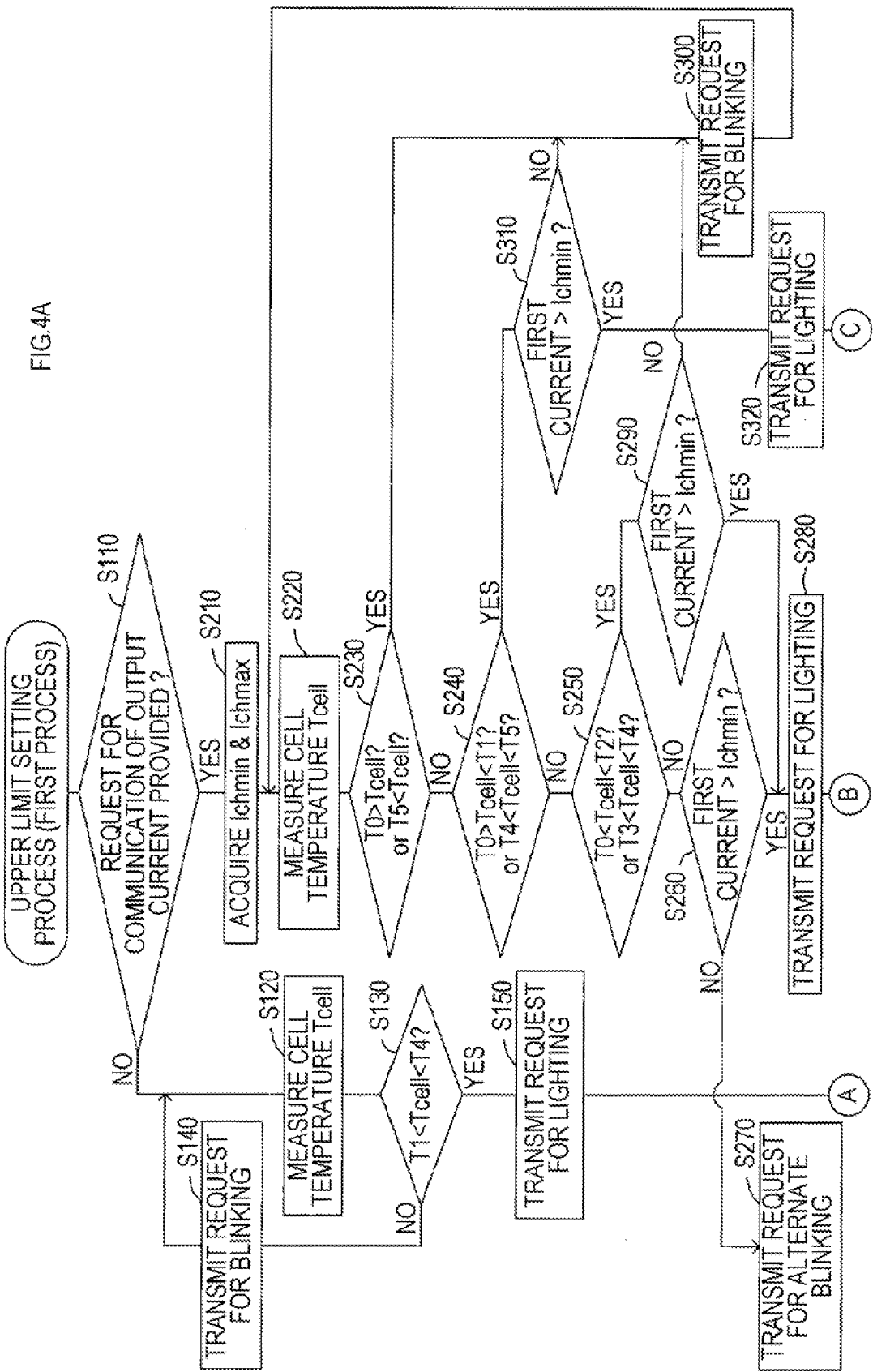
FIG. 4A is a flowchart showing part of an upper limit setting process (first process) performed by the battery control circuit when the charger is connected.

As shown in FIG. 4A, in the first process, it is first determined in S110 (S stands for step) whether a request for communication of output current is provided by the charge control circuit 70.

If the request for communication of output current is not provided, the process proceeds to S120, where a cell temperature Tcell (battery temperature, in other words) is measured via the temperature detection circuit 22, and the process proceeds to S130.

In S130, it is determined whether the cell temperature Tcell is within a temperature range from the above-described low temperature range to the above-described high temperature range (T1-T4). If the cell temperature Tcell is not within the temperature range, the process proceeds to S140, where a request for blinking the LED 1 is transmitted to the charge control circuit 70. As a result, the charge control circuit 70 becomes a charging standby state, in which the charge control circuit 70 stands by for charging of the battery 10, and informs a user of that effect by blinking the LED 1 of the indication unit 64.

On the other hand, if it is determined in S130 that the cell temperature Tcell is within the temperature range from the low temperature range to the high temperature range (T1-T4), the process proceeds to S150, where a request for lighting the LED 1 is transmitted to the charge control circuit 70. Then, the charge control circuit 70 lights the LED 1 of the indication unit 64, to thereby inform the user that regular charging of the battery 10 is to be started.

Figure 4B:
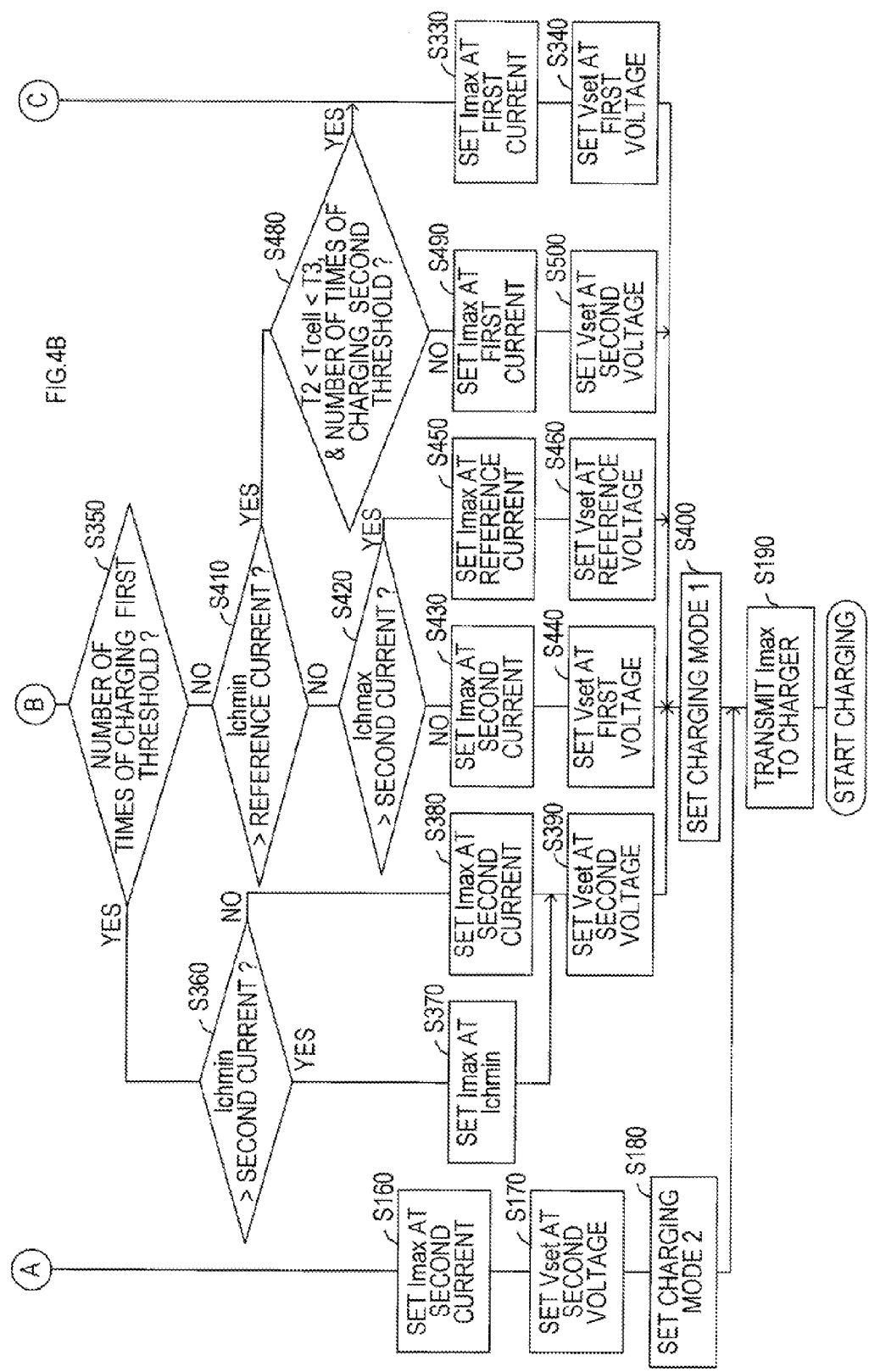
FIG. 4B is a flowchart showing the remainder of the upper limit setting process (first process)

When the battery control circuit 30 transmits the request for lighting the LED 1 in S150, the process proceeds to S160 shown in FIG. 4B, where the second current characteristic in which an upper limit current value with respect to the cell temperature Tcell is smallest is selected as the charging current characteristic. Then, in S160, a second current corresponding to the present cell temperature Tcell measured in S120 is read from the selected second current characteristic, and a value of the current is set as the upper limit charging current Imax at the time of charging.

In the subsequent S170, the second voltage characteristic in which a charging voltage value with respect to the cell temperature Tcell is smallest is selected as the charging voltage characteristic. A second voltage corresponding to the present cell temperature Tcell is read from the second voltage characteristic, and a value of the voltage is set as a charging completion voltage Vset used to determine completion of charging of the battery 10.

In the subsequent S180, a charging mode 2 is set as a charging mode of the battery 10, and in S190, the upper limit charging current Imax is transmitted to the charge control circuit 70. Then, the charge control circuit 70 sets an output current from the charging circuit 62 at an output current equal to or smaller than the upper limit charging current Imax, and starts charging of the battery 10 by the charging circuit 62.

Next, if it is determined in S110 that the request for communication of output current is provided by the charge control circuit 70, the process proceeds to S210, where the minimum current value Ichmin and the maximum current value Ichmax that can be outputted from the charger 50 (specifically, the charging circuit 62) to the battery 10 are acquired through communication with the charge control circuit 70.

In the subsequent S220, the cell temperature Tcell (battery temperature) is measured via the temperature detection circuit 22, and it is determined in S230 whether the cell temperature Tcell is lower than the lowest temperature T0 in the low-temperature-side extended range (T0-T1) or higher than the highest temperature T5 in the high-temperature-side extended range (T4-T5).

That is, in S230, it is determined whether the cell temperature Tcell is out of a temperature range in which charging is possible (T0-T5) corresponding to the first voltage characteristic and the first current characteristic.

If the cell temperature Tcell is not within the temperature range (T0-T5), the process proceeds to S300, where a request for blinking the LED 1 is transmitted to the charge control circuit 70 similarly to S140, to thereby bring the charge control circuit 70 into the charging standby state, and the user is informed of that effect. Then, the process proceeds to S220.

If it is determined in S230 that the cell temperature Tcell is within the temperature range in which charging is possible (T0-T5) corresponding to the first voltage characteristic and the first current characteristic, the process proceeds to S240, and it is determined whether the cell temperature Tcell is within the low-temperature-side extended range (T0-T1) or within the high-temperature-side extended range (T4-T5).

If the cell temperature Tcell is within the low-temperature-side extended range (T0-T1) or within the high-temperature-side extended range (T4-T5), the process proceeds to S310, where a first current corresponding to the present cell temperature Tcell is read from the first current characteristic in the ROM 34, and it is determined whether the minimum current value Ichmin acquired from the charger 50 in S210 is smaller than the read first current.

If the minimum current value Ichmin that can be outputted from the charger 50 is equal to or larger than the first current, the charging current is too large, and thus, the process proceeds to S300, where the charge control circuit 70 is brought into a charging standby state.

On the other hand, if the minimum current value Ichmin that can be outputted from the charger 50 is smaller than the first current, charging (low-speed charging with low current and low voltage, in this case) of the battery 10 is possible with the charging current equal to or smaller than the first current, even when the cell temperature Tcell is within the low-temperature-side extended range (T0-T1) or within the high-temperature-side extended range (T4-T5).

Thus, if it is determined in S310 that the minimum current value Ichmin is smaller than the first current, the process proceeds to S320, where a request for lighting the LED 1 and the LED 3 is transmitted to the charge control circuit 70. Then, the charge control circuit 70 lights the LED 1 and the LED 3, to thereby inform the user that the low-speed charging is to be performed.

In this way, after the request for lighting the LED 1 and the LED 3 is transmitted in S320, the process proceeds to S330 shown in FIG. 4B, where the first current characteristic is selected as the charging current characteristic. Then, in S330, the first current corresponding to the present cell temperature Tcell is read from the selected first current characteristic, and a value of the current is set as the upper limit charging current Imax at the time of charging.

In the subsequent S340, the first voltage characteristic is selected as the charging voltage characteristic, and a first voltage corresponding to the present cell temperature Tcell is read from the first voltage characteristic. A value of the voltage is set as the charging completion voltage Vset, and the process proceeds to S400.

In S400, a charging mode 1 is set as the charging mode of the battery 10. Then, after the setting of the charging mode, the upper limit charging current Imax is transmitted to the charge control circuit 70 in S190, to thereby cause the charge control circuit 70 to start charging the battery 10 with the charging current equal to or smaller than the upper limit charging current Imax.

Next, if it is determined in S240 that the cell temperature Tcell is not within the low-temperature-side extended range (T0-T1) or within the high-temperature-side extended range (T4-T5), the process proceeds to S250, where it is determined whether the cell temperature Tcell is within the low temperature range (T1-T2) or within the high temperature range (T3-T4).

If the cell temperature Tcell is within the low temperature range (T1-T2) or within the high temperature range (T3-T4), the process proceeds to S290, where it is determined whether the minimum current value Ichmin is smaller than the first current corresponding to the present cell temperature Tcell, similarly to the above-described S310.

If the minimum current value Ichmin is equal to or larger than the first current, the charging current is too large, and thus, the process proceeds to S300, where the charge control circuit 70 is brought into a charging standby state. If the minimum current value Ichmin is smaller than the first current, charging of the battery 10 is possible with the charging current equal to or smaller than the first current, and thus, the process proceeds to S280, where a request for lighting the LED 1 is transmitted to the charge control circuit 70.

On the other hand, if it is determined in S250 that the cell temperature Tcell is not within the low temperature range (T1-T2) or within the high temperature range (T3-T4), i.e., if the cell temperature Tcell is within the ordinary temperature range (T2-T3), the process proceeds to S260.

In S260, it is determined whether the minimum current value Ichmin is smaller than the first current corresponding to the present cell temperature Tcell, similarly to the above-described S310 and S290. If the minimum current value Ichmin is equal to or larger than the first current, the charging current is too large and, in addition, the minimum current value Ichmin does not become smaller than the first current because of a subsequent change in temperature, and thus, the process proceeds to S270, where a request for alternate blinking of the LED 1 and the LED 2 is transmitted to the charge control circuit 70.

Then, the charge control circuit 70 blinks the LED 1 and the LED 2 alternately, to thereby inform the user that the charger 50 cannot charge the battery 10 connected thereto at present (unchargeable).

If it is determined in S260 that the minimum current value Ichmin is smaller than the first current, charging of the battery 10 is possible with the charging current equal to or smaller than the first current, and thus, the process proceeds to S280, where a request for lighting the LED 1 is transmitted to the charge control circuit 70.

When the request for lighting the LED 1 is transmitted to the charge control circuit 70 in S280, the charge control circuit 70 lights the LED 1 of the indication unit 64, to thereby inform the user that regular charging of the battery 10 is to be started, similarly to S150, in which the request for lighting the LED 1 is transmitted.

After the battery control circuit 30 has transmitted the request for lighting the LED 1 in S280, the process proceeds to S350 in FIG. 4B. The battery control circuit 30 performs processes in and after S350, to thereby set the upper limit charging current Imax and the charging completion voltage Vset at the time of regular charging of the battery 10.

In S350, a counter value (number of times of charging) is read from a charging counter in the RAM 36 that is updated each time the battery 10 is charged, and it is determined whether the number of times the battery 10 has been charged is equal to or larger than a first threshold (500 times, for example). The charging counter is provided to a non-volatile area of the RAM 36.

If it is determined in S350 that the number of times of charging is equal to or larger than the first threshold, the process proceeds to S360, where it is determined whether the minimum current value Ichmin is larger than the second current obtained from the second current characteristic and the present cell temperature Tcell.

If the minimum current value Ichmin is larger than the second current, the process proceeds to S370, where the upper limit charging current Imax is set at the minimum current value Ichmin. If the minimum current value Ichmin is equal to or smaller than the second current, the process proceeds to S380, where the upper limit charging current Imax is set at the second current.

In the subsequent S390, the second voltage characteristic is selected as the charging voltage characteristic, and the charging completion voltage Vset is set at the second voltage obtained from the selected second voltage characteristic and the present cell temperature Tcell.

In a case where the number of times the battery 10 has been charged is equal to or larger than the first threshold, the number of times the battery 10 has been used is large, which may result in deterioration of the battery 10, and thus, in S360-S390, the upper limit charging current Imax and the charging completion voltage Vset are set at the smallest values, so that the battery 10 can be charged gently.

Next, if it is determined in S350 that the number of times of charging is smaller than the first threshold, the process proceeds to S410, where it is determined whether the minimum current value Ichmin is larger than a reference current obtained from the reference current characteristic and the present cell temperature Tcell.

If the minimum current value Ichmin is equal to or smaller than the reference current, the process proceeds to S420, where it is determined whether the maximum current value Ichmax that can be outputted from the charger 50 is larger than the second current obtained from the second current characteristic and the present cell temperature Tcell.

If it is determined in S420 that the maximum current value Ichmax is equal to or smaller than the second current, the output current from the charger 50 does not exceed the second current, and thus, the process proceeds to S430, where the upper limit charging current Imax is set at the second current.

In the subsequent S440, the first voltage characteristic is selected as the charging voltage characteristic, and the charging completion voltage Vset is set at the first voltage obtained from the selected first voltage characteristic and the present cell temperature Tcell, to thereby set the charging completion voltage Vset to be higher than a reference voltage.

This is because the charging current to the battery 10 is equal to or smaller than the second current, which is smaller than the reference current, and the battery 10 can be charged without deterioration of the battery 10 even when the charging voltage is set to be higher than the reference voltage.

If it is determined in S420 that the maximum current value Ichmax is larger than the second current, a value of the current that can be outputted from the charger 50 is between the second current and the reference current, and thus, the process proceeds to S450, where the upper limit charging current Imax is set at the reference current.

In the subsequent S460, the reference voltage characteristic is selected as the charging voltage characteristic, and the charging completion voltage Vset is set at the reference voltage obtained from the selected reference voltage characteristic and the present cell temperature Tcell.

If it is determined in S410 that the minimum current value Ichmin is larger than the reference current, the process proceeds to S480, where it is determined whether the cell temperature Tcell is within the ordinary temperature range (T2-T3) and also the number of times the battery 10 has been charged is equal to or smaller than a second threshold (100 times, for example).

If it is determined in S480 that the cell temperature Tcell is within the ordinary temperature range (T2-T3) and also the number of times of charging is equal to or smaller than the second threshold, the cell temperature Tcell is within the temperature range in which deterioration of the battery 10 is less likely to progress, and the degree of progress of battery deterioration due to frequent use thereof is small. Thus, the upper limit charging current Imax is set at the first current in S330, and the charging completion voltage Vset is set at the first voltage in S340.

On the other hand, if a negative determination is made in S480, the process proceeds to S490, where the upper limit charging current Imax is set at the first current, which is larger than the reference current and, in S500, the charging completion voltage Vset is set at the second voltage, which is smaller than the reference voltage.

This is because the current that can be outputted from the charger 50 cannot be reduced to the reference current or smaller. That is, in S490 and S500, the charging completion voltage Vset is set at the second voltage, which is smaller than the reference voltage, by way of compensation for the upper limit charging current Imax set at the first current, which is larger than the reference current. Thus, the battery 10 can be charged without deterioration of the battery 10.

Then, after the upper limit charging current Imax and the charging completion voltage Vset are set in S330, S340, S370-S390, S430, S460, S490, and S500 as above, the process proceeds to S400, where the charging mode is set at the charging mode 1. In S190, the upper limit charging current Imax is transmitted to the charge control circuit 70, to thereby cause the charger 50 to start charging the battery 10.

Figure 5A:
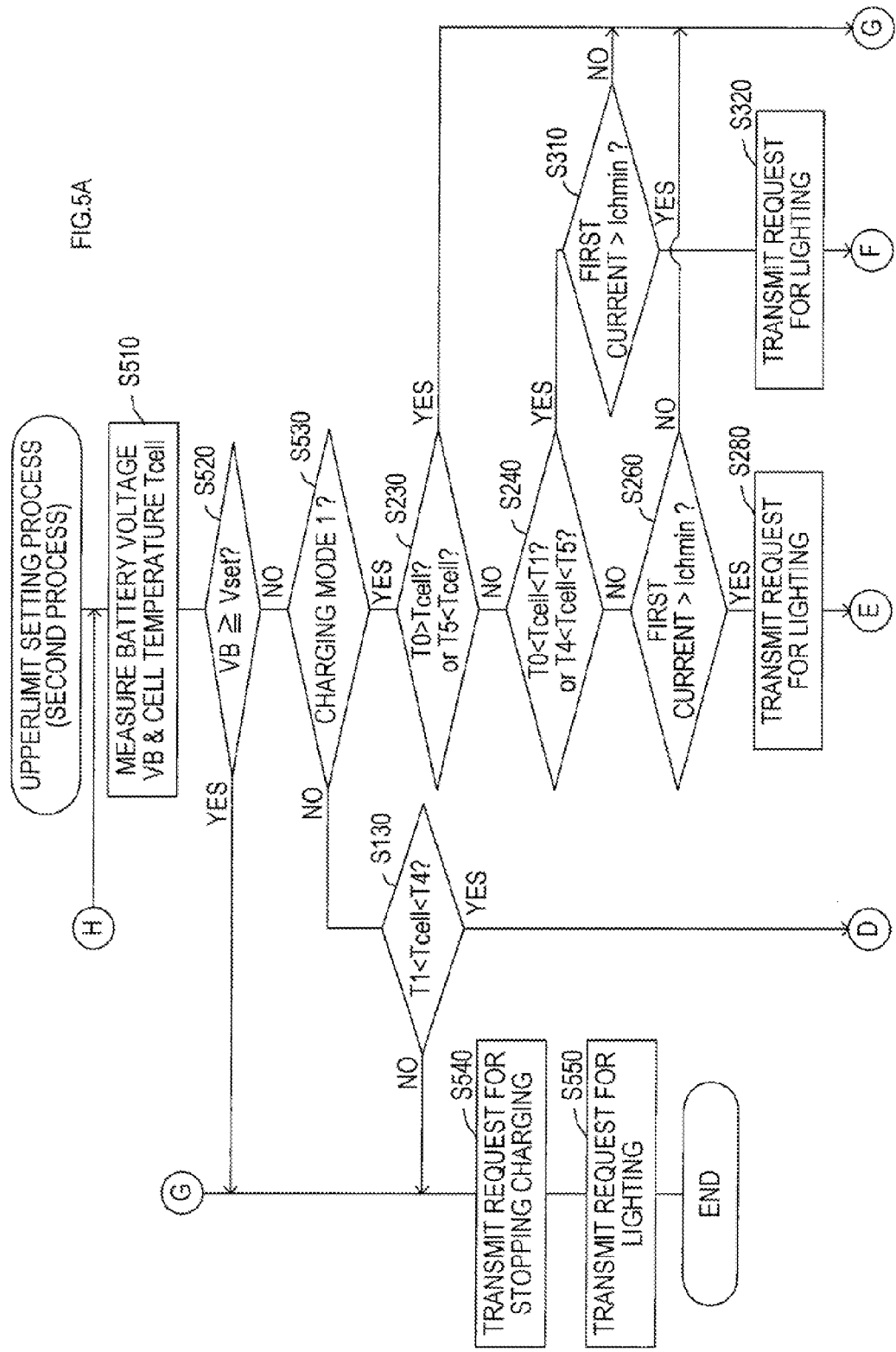
FIG. 5A is a flowchart showing part of an upper limit setting process (second process) performed by the battery control circuit during charging.

When the charging of the battery 10 by the charger 50 is started (during charging of the battery 10, in other words), the battery control circuit 30 performs the second process through steps shown in FIG. 5A and FIG. 5B.

In FIG. 5A and FIG. 5B, steps similar to those shown in FIG. 4A and FIG. 4B are assigned with the same step numbers. Thus, in the explanation below, the detailed explanation of the steps having the same step numbers as those in FIG. 4A and FIG. 4B is omitted.

As shown in FIG. 5A, in the second process, first in S510, the battery voltage VB is measured via the voltage detection circuit 20, and the cell temperature Tcell (battery temperature) is measured via the temperature detection circuit 22.

In S520, it is determined whether the battery voltage VB is equal to or larger than the charging completion voltage Vset. If the battery voltage VB is equal to or larger than the charging completion voltage Vset, the process proceeds to S540. In S540, a request for stopping charging is transmitted to the charge control circuit 70, to thereby stop charging of the battery 10 by the charging circuit 62. In the subsequent S550, a request for blinking the LED 2 is transmitted to the charge control circuit 70, and the second process ends. As a result, the charge control circuit 70 lights the LED 2 of the indication unit 64, to thereby inform the user that charging of the battery 10 is completed.

If it is determined in S520 that the battery voltage VB is smaller than the charging completion voltage Vset, charging of the battery 10 is not completed, and thus, the process proceeds to S530, where it is determined whether the charging mode is set at the charging mode 1.

If the charging mode is not the charging mode 1, the process proceeds to S130, where it is determined whether the cell temperature Tcell is within the temperature range from the low temperature range to the high temperature range (T1-T4), in which charging in the charging mode 2 is permitted.

If it is determined in S130 that the cell temperature Tcell is not within the temperature range (T1-T4), the processes in S540 and S550 are performed, and the second process ends. If it is determined in S130 that the cell temperature Tcell is within the temperature range from the low temperature range to the high temperature range (T1-T4), the process proceeds to S160 in FIG. 5B.

Similarly to the processes in FIG. 4B, the upper limit charging current Imax is set at the second current in S160 and the charging completion voltage Vset is set at the second voltage in S170, and subsequently, the upper limit charging current Imax is transmitted to the charge control circuit 70 in S190. Then, the process proceeds to S510.

If it is determined in S530 that the charging mode is the charging mode 1, the process proceeds to S230, and subsequently, the upper limit charging current Imax and the charging completion voltage Vset are set through steps approximately the same as those in the first process shown in FIG. 4A and FIG. 4B.

After the upper limit charging current Imax and the charging completion voltage Vset are set, the upper limit charging current Imax is transmitted to the charge control circuit 70 in S190, and the process proceeds to S510. The processes in and after S230 are different from those in the first process shown in FIG. 4A and FIG. 4B in terms of the following points.

Specifically, in the second process, the processes in S250 and S290 are not performed. If it is determined in S230 that the cell temperature Tcell is out of the temperature range in which charging is possible (T0-T5), or if it is determined in S260 or S310 that the minimum current value Ichmin is equal to or larger than the first current, the processes in S540 and S550 are performed, and then, the upper limit setting process ends.

As explained above, in the charging system of the present embodiment, three kinds of charging current characteristics, i.e., the reference current characteristic, the first current characteristic, and the second current characteristic, are stored in the ROM 34 in the battery control circuit 30 as the charging current characteristics. In addition, correspondingly to these charging current characteristics, three kinds of charging voltage characteristics, i.e., the reference voltage characteristic, the first voltage characteristic, and the second voltage characteristic are also stored in the ROM 34.

By performing the upper limit setting process, the battery control circuit 30 selects a characteristic suitable for charging the battery 10 from among a plurality of the charging current characteristics and a plurality of the charging voltage characteristics, on the basis of the values of the outputtable current from the charger 50 (specifically, the minimum current value Ichmin and the maximum current value Ichmax that can be outputted by the charger 50) and/or the number of times the battery 10 has been charged (deterioration state of the battery 10, in other words), etc., and sets the upper limit charging current Imax and the charging completion voltage Vset (S350-S500).

Thus, with the charging system of the present embodiment, it is possible to set the upper limit charging current Imax and the charging completion voltage Vset suitable for charging the battery 10 according to states of the charger 50 and the battery 10.

Moreover, when outputtable current values (the minimum current value Ichmin and the maximum current value Ichmax) cannot be acquired from the charger 50, the battery control circuit 30 sets the upper limit charging current Imax at the second current and sets the charging completion voltage Vset at the second voltage on the condition that the battery temperature (cell temperature Tcell) is within the low temperature range, the ordinary temperature range, or the high temperature range (T1-T4) (S130, S160, and S170).

Thus, even in the case where the outputtable current values cannot be acquired from the charger 50, the battery control circuit 30 can cause the charger 50 to charge the battery 10.

In the first current characteristic, the extended temperature ranges having a temperature lower or higher than that in the temperature range in the reference current characteristic is set as the temperature ranges in which charging of the battery 10 is possible. In the first voltage characteristic, the extended ranges having a temperature lower or higher than that in the temperature range in the reference voltage characteristic is set as the temperature ranges in which charging of the battery 10 is possible. Thus, when the cell temperature Tcell (battery temperature) is within the extended ranges, the first current characteristic and the first voltage characteristic are selected and the upper limit charging current Imax and the charging completion voltage Vset are set, to thereby enable extension of the temperature range in which charging of the battery 10 is possible.

Furthermore, in the case where the low-speed charging of the battery 10 is performed by selecting the first current and the first voltage as the upper limit charging current Imax and the charging completion voltage Vset, respectively, in the extended ranges, an indication state of the indication unit 64 (the LED 1 and the LED 3 light up) is different from that at the time of the regular charging.

Thus, the user can detect that it will take time to charge the battery 10 from the indication state of the indication unit 64, and thus, an uncomfortable feeling of the user caused by the low-speed charging can be reduced.

In the case where the cell temperature Tcell (battery temperature) is within any of the low temperature range, the ordinary temperature range, the high temperature range, and the extended ranges defined by the charging current characteristic and the charging voltage characteristic, whether to start charging in each of the temperature ranges is determined on the basis of the first current in each of the temperature ranges and the minimum current value Ichmin that can be outputted from the charger 50 (S220-S320).

Consequently, the temperature range in which charging of the battery 10 by the charger 50 can be started is to be determined on the condition that the minimum current value Ichmin that can be outputted from the charger 50 is smaller than the first current as a result of this determination operation.

Therefore, with the charging system of the present embodiment, a situation can be inhibited in which the charging current exceeds the upper limit immediately after charging of the battery 10 by the charger 50 is started to thereby cause deterioration of the battery 10.

In the present embodiment, the temperature detection circuit 22 corresponds to one example of a temperature detection unit of the present invention, the ROM 34 corresponds to one example of a storage unit of the present invention, and the battery control circuit 30 that performs the upper limit setting process corresponds to one example of an upper limit setting unit of the present invention.

In the upper limit setting process, the processes (S260, S270, S290-S310, S540, etc.) that prohibit the charger 50 from charging the battery 10 when the minimum current value Ichmin that can be outputted from the charger 50 is equal to or larger than the first current function as one example of a first charge permission unit of the present invention.

In the upper limit setting process, the processes (S220-S320) that determine the temperature range in which charging of the battery 10 is to be started on the basis of the minimum current value Ichmin that can be outputted from the charger 50 and the first current when the charger is connected function as one example of a determination unit of the present invention.

In the upper limit setting process, the processes (S110-S130, S160, and S170) that cause charging of the battery 10 when the outputtable current value cannot be acquired from the charger 50 function as one example of a charge permission unit of the present invention.

Modified Example

In the present embodiment, when the outputtable current values (the minimum current value Ichmin and the maximum current value Ichmax) cannot be acquired from the charger 50, the upper limit charging current Imax and the charging completion voltage Vset are respectively set at the second current and the second voltage, and the charger 50 is caused to charge the battery 10, provided that the cell temperature Tcell is within the specified temperature range (T1-T4).

On the other hand, it may be possible to prohibit the charger 50 from charging the battery 10 when the outputtable current values (the minimum current value Ichmin and the maximum current value Ichmax) cannot be acquired from the charger 50.

Figure 6B:
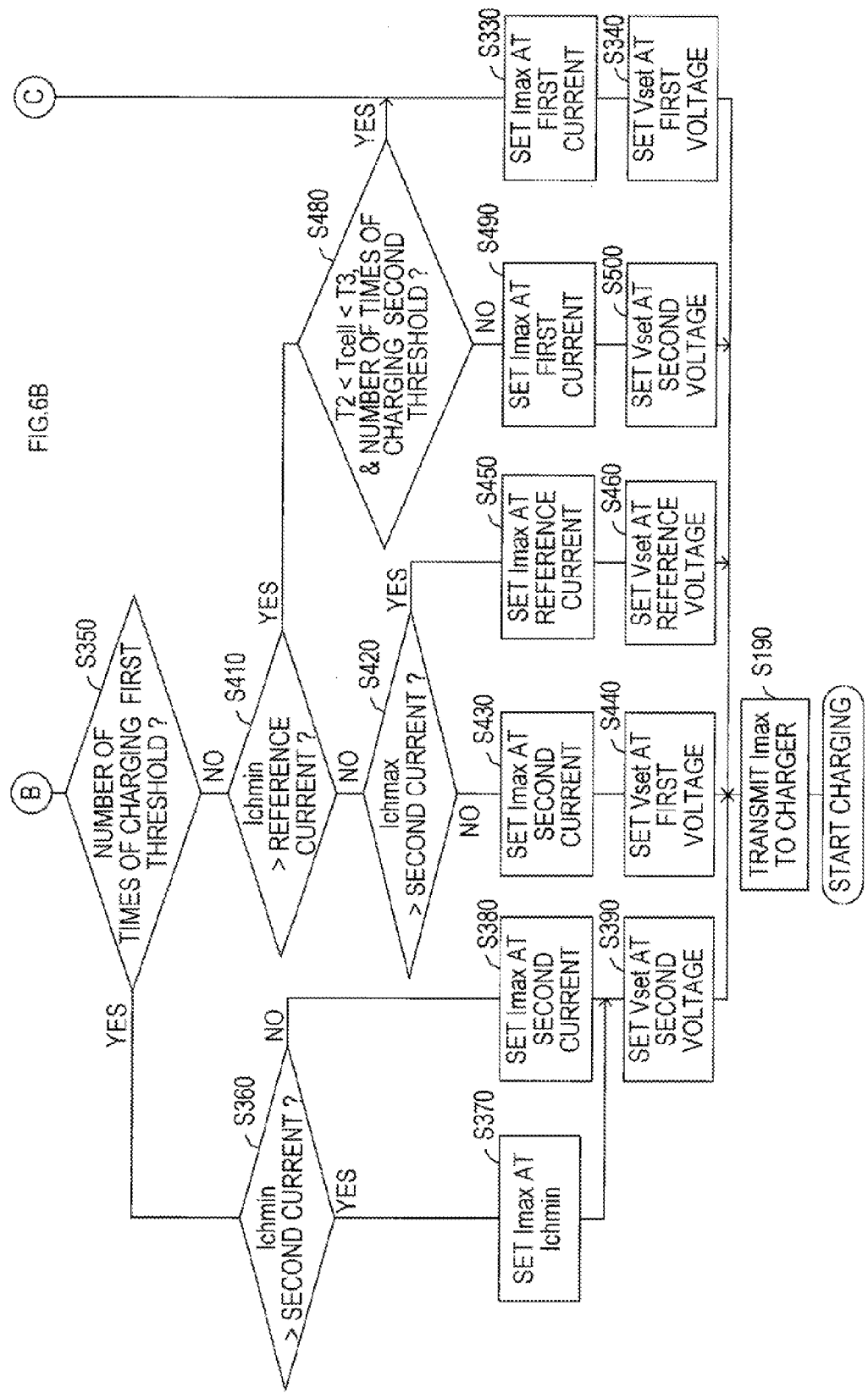
FIG. 6B is a flowchart showing the modified example of the upper limit setting process (first process) shown in FIG. 4B.

In this case, the battery control circuit 30 may be configured to perform the upper limit setting process (first process) at connection to the charger as shown in FIG. 6A and FIG. 6B, and to perform the upper limit setting process (second process) during charging as shown in FIG. 7.

Specifically, in the first process, as shown in FIG. 6A and FIG. 6B, if it is determined in S110 that a request for communication of output current is not provided by the charger 50, the outputtable current cannot be acquired from the charger 50. Thus, the process proceeds directly to S270, and the processes in S120-S180 shown in FIG. 4A and FIG. 4B are designed not to be performed.

In such a case, setting of the charging mode is unnecessary, and thus, the process in S400 is also designed not to be performed. In the second process, as shown in FIG. 7, the processes in S530 and S130 shown in FIG. 5A respectively performing determination of the charging mode and determination of the cell temperature Tcell in the case of the charging mode 2 are designed not to be performed.

The second process in FIG. 7 corresponds to that shown in FIG. 5A, and the latter half thereof is omitted. The latter half may be performed similarly to that in the first process shown in FIG. 6B.

A desired object of the present invention can be attained also by the above configuration. In this modified example, the processes in S110 and S270 function as one example of a second charge permission unit of the present invention.

Second Embodiment

In the first embodiment, the explanation has been given of the example in which the battery control circuit 30 acquires the outputtable current values (the minimum current value Ichmin and the maximum current value Ichmax) from the charger 50 and sets the upper limit charging current Imax and the charging completion voltage Vset using the current values. However, it may be possible to set the charging completion voltage Vset using an actual charging current actually supplied from the charger 50 to the battery 10.

As a second embodiment of the present invention, an explanation will be given of the upper limit setting process performed by the battery control circuit 30 when the charging completion voltage Vset is set using the actual charging current, with reference to FIG. 8 and FIG. 9.

Figure 8:
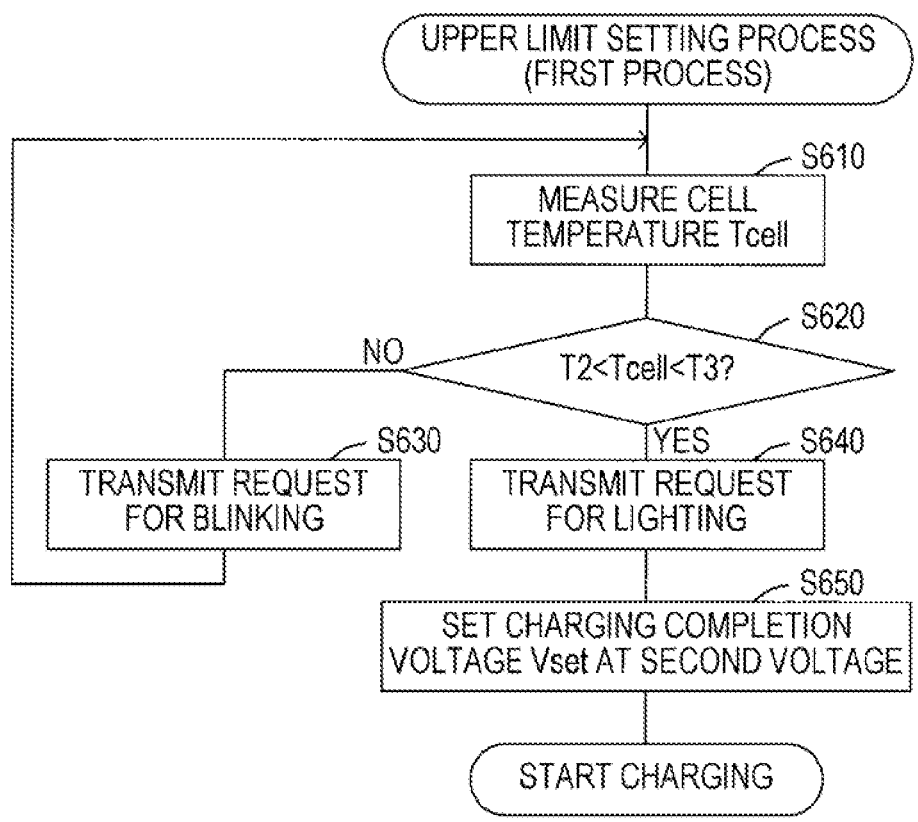
FIG. 8 is a flowchart showing an upper limit setting process (first process) performed by a battery control circuit of a second embodiment when the charger is connected.

As shown in FIG. 8, in the upper limit setting process (the first process) performed at connection to the charger, first in S610, the cell temperature Tcell (battery temperature) is measured via the temperature detection circuit 22. In the subsequent S620, it is determined whether the cell temperature Tcell is within the ordinary temperature range (T2-T3). If the cell temperature Tcell is not within the temperature range, the process proceeds to S630, where a request for blinking the LED 1 is transmitted to the charge control circuit 70, and the process proceeds to S610 again.

When the request for blinking the LED 1 is transmitted in S630, the charge control circuit 70 becomes a charging standby state, in which the charge control circuit 70 stands by for charging of the battery 10, and informs the user of that effect by blinking the LED 1 of the indication unit 64.

If it is determined in S620 that the cell temperature Tcell is within the ordinary temperature range (T2-T3), the process proceeds to S640, where a request for lighting the LED 1 is transmitted to the charge control circuit 70. Then, the charge control circuit 70 lights the LED 1 of the indication unit 64, to thereby inform the user that regular charging of the battery 10 is to be started.

After the request for lighting the LED 1 is transmitted to the charge control circuit 70, the process proceeds to S650, where the charging completion voltage Vset is set at the second voltage obtained from the present cell temperature Tcell and the second voltage characteristic. The second voltage is transmitted to the charge control circuit 70, to thereby cause the charger 50 to start charging the battery 10.

A reason why the second voltage is set as the charging completion voltage Vset to start charging when the cell temperature Tcell is within the ordinary temperature range (T2-T3) as above is that the actual charging current cannot be detected when the charger is connected.

Specifically, when the cell temperature Tcell is within the ordinary temperature range (T2-T3), the first current is the highest, and thus, the charging current supplied from the charger 50 to the battery 10 is inhibited from reaching the upper limit by designing, in advance, the output current from the charger 50 not to exceed the first current in the ordinary temperature range. Thus, in the present second embodiment, the temperature at which charging is started is limited within the ordinary temperature range (T2-T3), to thereby enable safer charging of the battery 10.

Figure 9:
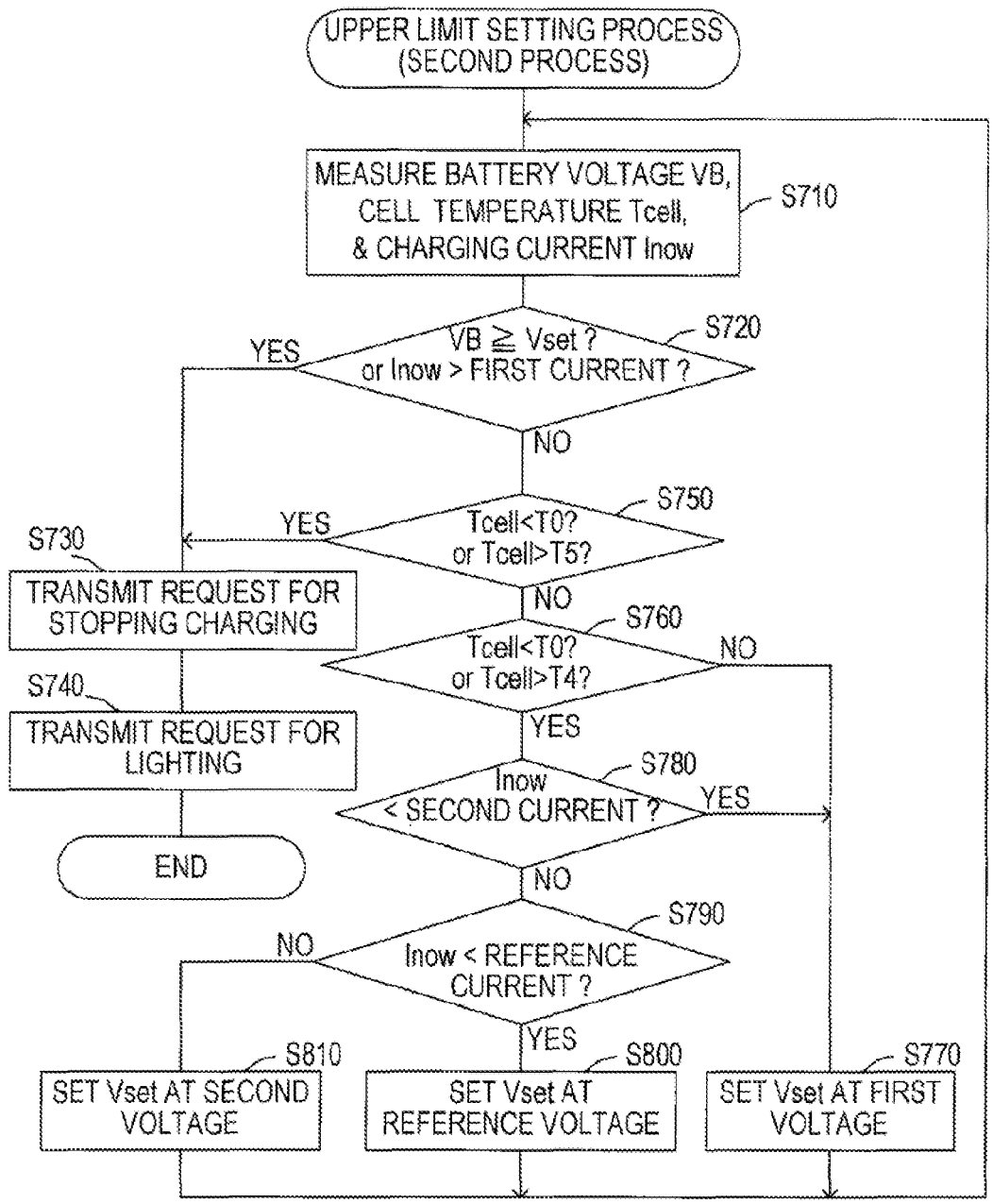
FIG. 9 is a flowchart showing an upper limit setting process (second process) performed by the battery control circuit of the second embodiment during charging.

In the upper limit setting process (the second process) performed during charging, as shown in FIG. 9, in S710, the battery voltage VB and the cell temperature Tcell are measured via the voltage detection circuit 20 and the temperature detection circuit 22, respectively. In addition, a charging current Inow actually flowing at present (actual charging current) is measured via the current detection circuit 24.

In the subsequent S720, it is determined whether the battery voltage VB has reached the charging completion voltage Vset or whether the charging current Inow is larger than the first current. The first current is a value of the current obtained from the first current characteristic on the basis of the present cell temperature Tcell.

If it is determined in S720 that the battery voltage VB has reached the charging completion voltage Vset or that the charging current Inow is larger than the first current, the process proceeds to S730, where a request for stopping charging is transmitted to the charge control circuit 70, to thereby stop the charging of the battery 10 by the charging circuit 62.

In the subsequent S740, a request for lighting the LED 2 is transmitted to the charge control circuit 70, and the second process ends. As a result, the charge control circuit 70 lights the LED 2 of the indication unit 64, to thereby inform the user that the charging of the battery 10 is completed.

If it is determined in S720 that the battery voltage VB is smaller than the charging completion voltage Vset and also that the charging current Inow is equal to or smaller than the first current, the process proceeds to S750. In S750, it is determined whether the cell temperature Tcell is lower than the lowest temperature T0 in the low-temperature-side extended range (T0-T1) or higher than the highest temperature T5 in the high-temperature-side extended range (T4-T5).

That is, in S750, it is determined whether the cell temperature Tcell is out of the temperature range in which charging is possible (T0-T5) corresponding to the first voltage characteristic and the first current characteristic. If the cell temperature Tcell is not within the temperature range (T0-T5), the process proceeds to S730, where the charging of the battery 10 by the charger 50 is stopped.

If the cell temperature Tcell is within the temperature range (T0-T5), the process proceeds to S760, where it is determined whether the cell temperature Tcell is lower than the lowest temperature T1 in the low temperature range or higher than the highest temperature T4 in the high temperature range.

That is, in S760, it is determined whether the cell temperature Tcell is out of the temperature range (T1-T4) from the low temperature range to the high temperature range. If it is determined that the cell temperature Tcell is out of the temperature range (T1-T4) (i.e., if the cell temperature Tcell is within the low-temperature-side extended range (T0-T1) or within the high-temperature-side extended range (T4-T5)), the process proceeds to S780, where it is determined whether the charging current Inow is smaller than the second current obtained from the second current characteristic.

If it is determined in S780 that the charging current Inow is smaller than the second current, or if it is determined in S760 that the cell temperature Tcell is within the above-described temperature range (T1-T4), the process proceeds to S770, where the charging completion voltage Vset is set at the first voltage obtained from the first voltage characteristic, and the process proceeds to S710.

On the other hand, if it is determined in S780 that the charging current Inow is equal to or larger than the second current, in the subsequent S790, it is determined whether the charging current Inow is smaller than the reference current obtained from the reference current characteristic.

If the charging current Inow is smaller than the reference current, in S800, the charging completion voltage Vset is set at the reference voltage obtained from the reference voltage characteristic, and the process proceeds to S710. If the charging current Inow is equal to or larger than the reference current, in S810, the charging completion voltage Vset is set at the second voltage obtained from the second voltage characteristic, and the process proceeds to S710.

In this way, in the present second embodiment, the charging current Inow actually supplied from the charger 50 to the battery 10 is measured, and the charging completion voltage Vset is set at any of the first voltage, the reference voltage, and the second voltage on the basis of the value of the current.

Thus, in the charging system of the present second embodiment, the charging completion voltage Vset can be set according to the charging current Inow that the charger 50 can output actually. Consequently, also in the present second embodiment, the battery 10 can be charged according to the capability of the charger 50 without deterioration of the battery 10, similarly to the first embodiment.

Third Embodiment

In the first embodiment and the second embodiment, the explanation has been given of the examples in which the function as the upper limit setting unit of the present invention is fulfilled by the battery control circuit 30 in the battery pack 2. However, the function as the upper limit setting unit may be fulfilled by the charge control circuit 70 in the charger 50.

As a third embodiment of the present invention, an explanation will be given of a system configuration in a case where the charge control circuit 70 in the charger 50 fulfills a function as one example of the upper limit setting unit, and of the upper limit setting process to be performed by the charge control circuit 70.

Figure 10:
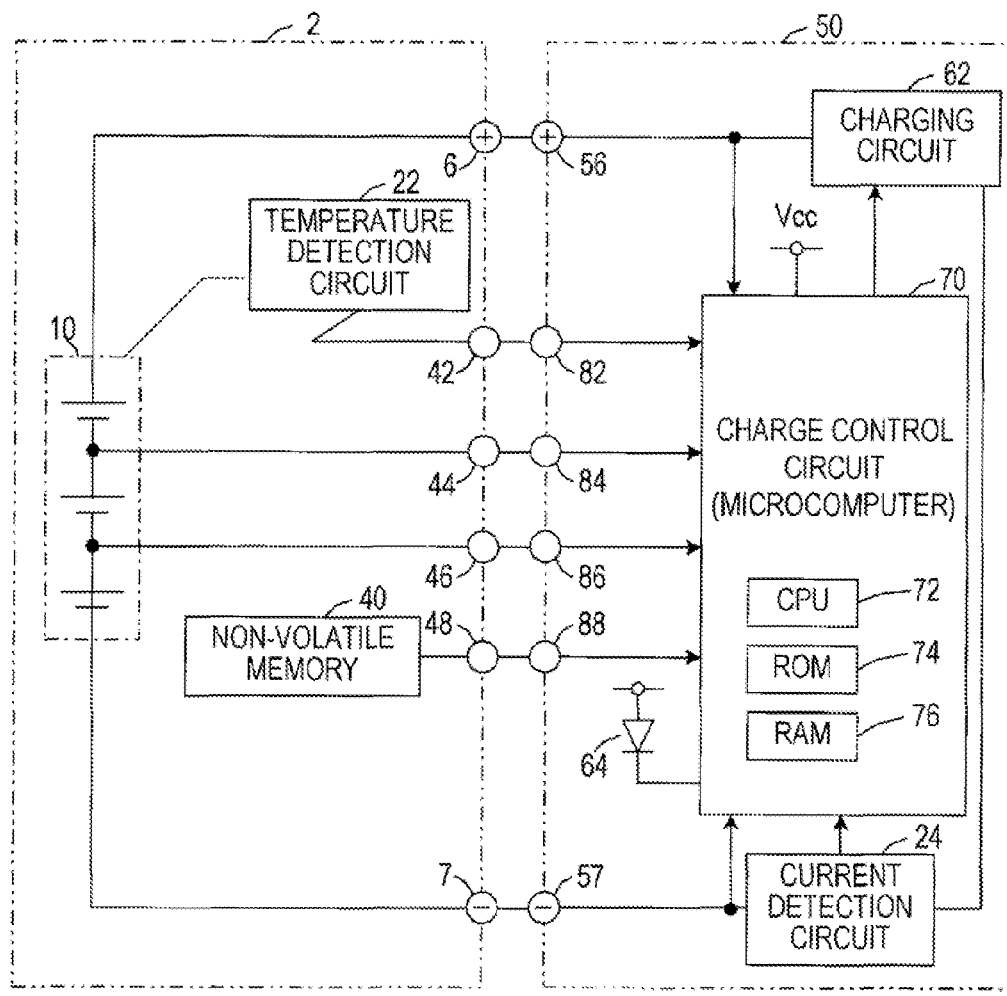
FIG. 10 is a circuit diagram showing a circuit configuration of a battery pack and a charger of a third embodiment.

As shown in FIG. 10, in the case where the charge control circuit 70 fulfills the function as one example of the upper limit setting unit, the battery control circuit 30 does not need to be provided in the battery pack 2. It is designed such that a detection signal from the temperature detection circuit 22 that detects the cell temperature Tcell can be inputted to the charge control circuit 70 via a terminal 42 of the battery pack 2 and a terminal 82 of the charger 50, and potentials between the cells of the battery 10 can be inputted to the charge control circuit 70 via terminals 44 and 46 of the battery pack 2 and terminals 84 and 86 of the charger 50.

The current detection circuit 24 is provided in the charger 50, and is configured to input a current detection signal to the charge control circuit 70. The charging voltage characteristics and the charging current characteristics shown in FIGS. 3A and 3B are characteristics specific to the battery 10, and thus, the battery pack 2 is provided with a non-volatile memory 40 in which these respective characteristics are stored.

When the battery pack 2 is attached to the charger 50, the charge control circuit 70 is connected to the non-volatile memory 40 via the terminal 48 of the battery pack 2 and the terminal 88 of the charger 50, to thereby enable reading of data of the above-described respective characteristics from the non-volatile memory 40.

The number of times of charging may be stored in the non-volatile memory 40, and when the charger 50 has charged the battery 10, the charge control circuit 70 may update the number of times of charging stored in the non-volatile memory 40.

The upper limit setting process to be performed by the charge control circuit 70 may be performed through steps basically similar to those in the upper limit setting process explained in the modified example of the first embodiment with reference to FIG. 6A, FIG. 6B, and FIG. 7.

However, the upper limit setting process (first process) shown in FIG. 6A is designed to be started by the charge control circuit 70 when the battery pack 2 is connected to the charger 50 (at connection of the battery), as shown in FIG. 11.

In the case where the charge control circuit 70 performs the upper limit setting process, the determination process in S110 shown in FIG. 6A is unnecessary because the outputtable current is stored in a ROM 74 in the charge control circuit 70.

As shown in FIG. 11, in the case where the charge control circuit 70 has started the upper limit setting process at connection of the battery, the cell temperature Tcell (battery temperature) is measured in S910. In the subsequent S920, the first current characteristic may be acquired from the non-volatile memory 40 in the battery pack 2, and subsequently, the processes in S230-S320 may be performed.

Effects similar to those in the first embodiment or the second embodiment can also be obtained when the upper limit setting process is performed as above by the charge control circuit 70 in the charger 50.

Although the embodiments of the present invention have been explained as above, the present invention is not limited to the above embodiments and can take various forms within the scope not departing from the gist of the present invention. For example, in the above-described respective embodiments, the explanation has been given of the example in which the upper limit of the charging voltage obtained from the charging voltage characteristic is used as the charging completion voltage for determination of completion of the charging of the battery 10. However, the upper limit of the charging voltage obtained from the charging voltage characteristic may be used to set at least one of an abnormality determination voltage for determining abnormality in the battery voltage, a CV value in performing a Constant Current—Constant Voltage (CCCV) charging, and a value of a target charging voltage during charging.

In the explanation of the above-described embodiments, the explanation has been given of the example in which the battery control circuit 30 communicates with the charge control circuit 70 when the control circuit 30 acquires the outputtable current values from the charger 50 and of the example in which the battery control circuit 70 reads the data from the non-volatile memory 40 in the battery pack 2 when the charge control circuit 70 acquires the charging current characteristic and the charging voltage characteristic from the battery pack 2.

However, it may be possible, for example, that the charger 50 or the battery pack 2 are assigned with identification information with which these characteristics can be identified, and that the outputtable current values from the charger 50 or the charging current characteristic and the charging voltage characteristic of the battery 10 are selected from the multiple pieces of information stored in advance by reading of the identification information by the battery control circuit 30 or the charge control circuit 70.

The identification information may be optically readable information, such as a bar code and a two-dimensional code, or may be electrical information that can be identified by detecting electrical characteristics, such as a resistance value.

On the other hand, in the above-described embodiments, the plurality of charging current characteristics and charging voltage characteristics that can be selected when charging the battery 10 are provided, and the charging current characteristic and the charging voltage characteristic are selected on the basis of the charging current (the minimum value thereof, especially), etc., that can be outputted from the charger 50, to thereby set the upper limits of the charging current and the charging voltage.

However, for example, as in the processes in S230-S320 shown in FIG. 4A, it is acceptable that the charging current characteristic and the charging voltage characteristic such as the first current characteristic and the first voltage characteristic having the extended chargeable temperature range compared with conventional configurations are provided, and that the temperature range in which the minimum value of the charging current does not exceed the defined current is set as a charging start temperature range using the value of the minimum current that can be outputted from the charger 50 and the charging current characteristic.

In this way, the temperature range in which charging of the battery 10 is performed can be changed according to the capability of the charger 50, to thereby enable extension of the temperature range in which the battery 10 can be charged compared with conventional configurations.

In this case, the charge control device may be configured to determine the temperature range in which charging is permitted according to the value of the minimum current that can be outputted by the charger. Specifically, the temperature range in which charging is permitted is designed to be extended when the value of the minimum current that can be outputted by the charger is smaller than the current value defined by the charging current characteristic.

This makes it possible to extend the chargeable temperature range while enhancing the reliability of charging by inhibiting deterioration of the battery due to charging, thereby enabling increase in convenience in the charging system. A battery for an electric power tool is required to be charged rapidly, and thus, the temperature at which charging can be performed in about one to two hours has been generally set as a temperature at which charging is permitted (permissive temperature) (T1-T4).

However, such a setting does not allow charging of the battery at a temperature (0° C. or lower, for example) lower than the permissive temperature, and thus, extension of the range of the permissive temperature is requested. If the range of the permissive temperature is extended in reply to such a request, the battery may be charged, in some cases, in excess of a range (current and voltage) in which the battery can be charged, either in the lower side or the higher side in the extended range of the permissive temperature, depending on the kind of the charger.

To cope with this, if the temperature range in which charging is permitted is to be determined according to the value of the minimum current that can be outputted by the charger as above, it becomes possible to utilize an existing charger and to set the widest possible range of the permissive temperature in which the battery can be charged in a normal way by the charger.

In this case, for example, in the first current characteristic in FIG. 3B, given that T1 is referred to as a first reference lowest temperature, that a current value within the temperature range from T1 to T2 is referred to as a reference lowest current value, and that a current value in the temperature range (T0-T1), which is lower than the first reference lowest temperature T1, is referred to as a first lowest charging current value, the temperature range may be set as below.

Specifically, it may be configured such that, in a case where the value of the minimum current that can be outputted by the charger is lower than the reference lowest current value and the first lowest charging current value, charging is permitted if the battery temperature is equal to or higher than a first lowest temperature T0, which is lower than the first reference lowest temperature T1.

For example, in the first current characteristic in FIG. 3B, given that T4 is referred to as a first reference highest temperature, that a current value within the temperature range from T3 to T4 is referred to as a reference lowest current value, and a current value in the temperature range (T4-T5), which is higher than the first reference highest temperature T4, is referred to as a second lowest charging current value, the temperature range may be set as below.

Specifically, it may be configured such that, in a case where the value of the minimum current that can be outputted by the charger is lower than the reference lowest current value and the second lowest charging current value, charging is permitted if the battery temperature is equal to or lower than a second highest temperature T5, which is higher than the first reference highest temperature T4.

On the other hand, the temperature range in which charging is permitted may be designed to be narrowed in a case where the value of the minimum current that can be outputted by the charger is higher than the current value defined by the charging current characteristic. This makes it possible, even in the case where a charger is unusable because the value of the minimum current that can be outputted from the charger is high and the temperature ranges in which charging cannot be permitted exist, to enable such a charger to be usable, while enhancing the reliability of charging by narrowing the temperature range in which charging is permitted.

For example, in the case where a lithium-ion battery specialized for higher capacity than before is used, the life span thereof cannot be maintained unless the charging current is decreased by way of compensation for the specialized higher capacity. The charger that could not be used previously for such a battery specialized for higher capacity because of the fixed permissive temperature becomes usable by changing the permissive temperature according to the value of the minimum current.

In this case, for example, in the first current characteristic in FIG. 3B, given that T2 is referred to as a second reference lowest temperature, that a current value within the temperature range from T1 to T2 is referred to as the reference lowest current value, and that a current value in the temperature range (T2-T3), which is higher than the second reference lowest temperature T2, is referred to as a third lowest charging current value, the temperature range may be set as below.

Specifically, it may be configured such that, in a case where the value of the minimum current that can be outputted from the charger is larger than the reference lowest current value and also smaller than the third lowest charging current value, charging is permitted if the battery temperature is equal to or higher than the second reference lowest temperature T2, which is higher than the first reference lowest temperature T1 (in other words, charging is prohibited if the battery temperature is lower than the second reference lowest temperature T2).

For example, in the first current characteristic in FIG. 3B, given that T3 is referred to as a second reference highest temperature, that a current value within the temperature range from T3 to T4 is referred to as the reference lowest current value, and that a current value in the temperature range (T2-T3), which is lower than the second reference highest temperature T3, is referred to as a fourth lowest charging current value, the temperature range may be set as below.

Specifically, it may be configured such that, in a case where the value of the minimum current that can be outputted from the charger is larger than the reference lowest current value and also smaller than the fourth lowest charging current value, charging is permitted if the battery temperature is equal to or lower than the second reference highest temperature T3, which is lower than the first reference highest temperature T4 (in other words, charging is prohibited if the battery temperature is higher than the second reference highest temperature T3).

On the other hand, in setting the temperature range in which charging is permitted on the basis of the value of the minimum current that can be outputted from the charger as above, the value of the minimum current may not be able to be acquired from the charger, in some cases. In such a case, for example, if the value of the minimum current that is the largest in the charger from which the value of the minimum current cannot be acquired is stored in advance and the temperature range in which charging is permitted is set on the basis of the value of the minimum current, the battery can be charged in a safe manner, using the charger from which the value of the minimum current cannot be acquired.

For example, in a case where the lithium-ion battery specialized for higher capacity than before is charged with the existing charger, the value of the minimum current may not be able to be acquired from the charger. However, since the manufacturer of the charger knows the value of the minimum current of the existing charger, the values of the minimum currents of the existing chargers of various kinds can be acquired.

Thus, it may be configured such that the value of the minimum current (i.e., the value of the largest minimum current) with which the battery can be charged in the safest manner in the acquired values of the minimum currents of the chargers of various kinds is stored in advance, and in the case where the value of the minimum current cannot be acquired from the charger, the temperature range is set using the stored value of the minimum current.

This makes it possible to charge the battery without reducing the reliability even when the charger used to charge the battery cannot output the value of the minimum current.

What is claimed is:

1. A charge control device comprising:
    a temperature detection unit that detects a battery temperature;
    a storage unit that stores a charging current characteristic indicating relationships between the battery temperature and an upper limit of a charging current, and a charging voltage characteristic indicating relationships between the battery temperature and an upper limit of a charging voltage; and
    an upper limit setting unit that sets each of the upper limits of the charging current and the charging voltage from a charger to a battery on a basis of the battery temperature detected by the temperature detection unit and the charging current characteristic and the charging voltage characteristic stored in the storage unit,
    wherein the storage unit stores, as the charging current characteristic, a reference current characteristic and at least one of a first current characteristic having a current value larger than that in the reference current characteristic with respect to the battery temperature and a second current characteristic having a current value smaller than that in the reference current characteristic with respect to the battery temperature, and also stores, as the charging voltage characteristic, a reference voltage characteristic and at least one of a first voltage characteristic having a voltage value larger than that in the reference voltage characteristic with respect to the battery temperature and a second voltage characteristic having a voltage value smaller than that in the reference voltage characteristic with respect to the battery temperature, and
    wherein the upper limit setting unit selects the charging current characteristic and the charging voltage characteristic used to set the upper limits of the charging current and the charging voltage to the battery from among a plurality of the charging current characteristics and a plurality of the charging voltage characteristics stored in the storage unit.

2. The charge control device according to claim 1, wherein the upper limit setting unit selects the charging current characteristic and the charging voltage characteristic on a basis of a parameter related to a value of the charging current from the charger to the battery.

3. The charge control device according to claim 2, wherein the upper limit setting unit selects the charging current characteristic and the charging voltage characteristic on a basis of a value of an outputtable current capable of being supplied from the charger to the battery.

4. The charge control device according to claim 3, wherein the upper limit setting unit selects, as the charging current characteristic and the charging voltage characteristic, the first current characteristic and the second voltage characteristic in a case where the value of the outputtable current is larger than the upper limit of the charging current obtained on a basis of the battery temperature detected by the temperature detection unit and the reference current characteristic stored in the storage unit.

5. The charge control device according to claim 1, wherein, in the first current characteristic and the first voltage characteristic, a temperature range in which the upper limits of the charging current and the charging voltage are set to permit charging is wider than a temperature range in the reference current characteristic and the reference voltage characteristic.

6. The charge control device according to claim 5, wherein, in a case where the upper limit setting unit selects, as the charging current characteristic and the charging voltage characteristic, the first current characteristic and the first voltage characteristic, respectively, and sets the upper limits of the charging current and the charging voltage within a temperature range other than the temperature range in the reference current characteristic and the reference voltage characteristic on a basis of the selected first current characteristic, the selected first voltage characteristic, and the battery temperature detected by the temperature detection unit, the upper limit setting unit informs a user of that effect.

7. The charge control device according to claim 1, comprising a first charge prohibition unit that prohibits the charger from charging the battery in a case where a value of an outputtable current capable of being supplied from the charger to the battery is equal to or larger than the upper limit of the charging current obtained on a basis of the battery temperature detected by the temperature detection unit and the first current characteristic.

8. The charge control device according to claim 7, comprising a second charge prohibition unit that prohibits the charger from charging the battery in a case where the value of the outputtable current is not acquired.

9. The charge control device according to claim 7, comprising a charge permission unit that permits the charger to charge the battery by setting values set in advance as the upper limits of the charging current and the charging voltage in a case where the value of the outputtable current is not acquired, provided that the battery temperature detected by the temperature detection unit is within a specified chargeable temperature range.

10. The charge control device according to claim 1, comprising a determination unit that determines a temperature range of the battery temperature in which charging of the battery is started, on a basis of the value of the outputtable current capable of being supplied from the charger to the battery and the first current characteristic.

11. The charge control device according to claim 10, 
wherein the storage unit is provided to the battery, and the determination unit is provided to the charger, and
wherein the determination unit acquires the first current characteristic from the storage unit provided to the battery and determines the temperature range.

12. The charge control device according to claim 2,
wherein the upper limit setting unit detects an actual charging current supplied from the charger to the battery, compares a value of the detected actual charging current with the upper limit of the charging current under a present temperature condition obtained from each charging current characteristic, and selects the charging voltage characteristic suitable for passage of the actual charging current on a basis of a comparison result.

13. The charge control device according to claim 12,
wherein the upper limit setting unit selects, as the charging voltage characteristic, the second voltage characteristic having the lowest upper limit of the charging voltage when charging of the battery by the charger is started.

14. The charge control device according to claim 13,
wherein the upper limit setting unit selects, as the charging voltage characteristic, the second voltage characteristic in a case where the battery temperature detected by the temperature detection unit is within a specified chargeable temperature range to cause the charger to start charging the battery, and subsequently, selects the charging voltage characteristic using the value of the actual charging current, thereby to set the upper limit of the charging voltage and to extend a temperature range in which charging of the battery is performed.

15. A battery pack comprising:
a battery; and
a charge control device comprising:
a temperature detection unit that detects a battery temperature;
a storage unit that stores a charging current characteristic indicating relationships between the battery temperature and an upper limit of a charging current, and a charging voltage characteristic indicating relationships between the battery temperature and an upper limit of a charging voltage; and
an upper limit setting unit that sets each of the upper limits of the charging current and the charging voltage from a charger to a battery on a basis of the battery temperature detected by the temperature detection unit and the charging current characteristic and the charging voltage characteristic stored in the storage unit,
wherein the storage unit stores, as the charging current characteristic, a reference current characteristic and at least one of a first current characteristic having a current value larger than that in the reference current characteristic with respect to the battery temperature and a second current characteristic having a current value smaller than that in the reference current characteristic with respect to the battery temperature, and also stores, as the charging voltage characteristic, a reference voltage characteristic and at least one of a first voltage characteristic having a voltage value larger than that in the reference voltage characteristic with respect to the battery temperature and a second voltage characteristic having a voltage value smaller than that in the reference voltage characteristic with respect to the battery temperature, and
wherein the upper limit setting unit selects the charging current characteristic and the charging voltage characteristic used to set the upper limits of the charging current and the charging voltage to the battery from among a plurality of the charging current characteristics and a plurality of the charging voltage characteristics stored in the storage unit.

16. A charger comprising:
a charge control device comprising:
a temperature detection unit that detects a battery temperature;
a storage unit that stores a charging current characteristic indicating relationships between the battery temperature and an upper limit of a charging current, and a charging voltage characteristic indicating relationships between the battery temperature and an upper limit of a charging voltage; and
an upper limit setting unit that sets each of the upper limits of the charging current and the charging voltage from a charger to a battery on a basis of the battery temperature detected by the temperature detection unit and the charging current characteristic and the charging voltage characteristic stored in the storage unit,
wherein the storage unit stores, as the charging current characteristic, a reference current characteristic and at least one of a first current characteristic having a current value larger than that in the reference current characteristic with respect to the battery temperature and a second current characteristic having a current value smaller than that in the reference current characteristic with respect to the battery temperature, and also stores, as the charging voltage characteristic, a reference voltage characteristic and at least one of a first voltage characteristic having a voltage value larger than that in the reference voltage characteristic with respect to the battery temperature and a second voltage characteristic having a voltage value smaller than that in the reference voltage characteristic with respect to the battery temperature, and
wherein the upper limit setting unit selects the charging current characteristic and the charging voltage characteristic used to set the upper limits of the charging current and the charging voltage to the battery from among a plurality of the charging current characteristics and a plurality of the charging voltage characteristics stored in the storage unit.

* * * * *